United States Patent
Lai et al.

(10) Patent No.: US 11,925,030 B2
(45) Date of Patent: Mar. 5, 2024

(54) METHOD FOR FORMING A MFMIS MEMORY DEVICE

(71) Applicant: Taiwan Semiconductor Manufacturing Company, Ltd., Hsin-Chu (TW)

(72) Inventors: Sheng-Chih Lai, Hsinchu County (TW); Chung-Te Lin, Tainan (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 197 days.

(21) Appl. No.: 17/518,950

(22) Filed: Nov. 4, 2021

(65) Prior Publication Data

US 2022/0059549 A1 Feb. 24, 2022

Related U.S. Application Data

(62) Division of application No. 16/866,727, filed on May 5, 2020, now Pat. No. 11,171,157.

(51) Int. Cl.
*H10B 51/30* (2023.01)
*H10B 41/23* (2023.01)
(Continued)

(52) U.S. Cl.
CPC ............ *H10B 51/30* (2023.02); *H10B 41/23* (2023.02); *H10B 41/27* (2023.02); *H10B 41/35* (2023.02);
(Continued)

(58) Field of Classification Search
CPC ........ H10B 41/23; H10B 41/27; H10B 41/35; H10B 43/23; H10B 51/20; H10B 51/30; H10B 51/40; H10B 51/50
See application file for complete search history.

(56) References Cited

U.S. PATENT DOCUMENTS 10,825,831 B1 11/2020 Koval et al.
2003/0178660 A1 9/2003 Schmid et al.
(Continued)

FOREIGN PATENT DOCUMENTS

CN 105304638 A * 2/2016
JP 2018037441 A * 3/2018
KR 20180059271 A 6/2018

OTHER PUBLICATIONS

Pahwa et al. "Numerical Investigation of Short-Channel Effects in Negative Capacitance MFIS and MFMIS Transistors: Above-Threshold Behavior" IEEE Transactions On Electron Devices, vol. 66, No. 3, Mar. 2019.

(Continued)

*Primary Examiner* — Matthew E Warren
(74) *Attorney, Agent, or Firm* — Eschweiler & Potashnik, LLC

(57) ABSTRACT

Various embodiments of the present application are directed towards a metal-ferroelectric-metal-insulator-semiconductor (MFMIS) memory device, as well as a method for forming the MFMIS memory device. According to some embodiments of the MFMIS memory device, a first source/drain region and a second source/drain region are vertically stacked. An internal gate electrode and a semiconductor channel overlie the first source/drain region and underlie the second source/drain region. The semiconductor channel extends from the first source/drain region to the second source/drain region, and the internal gate electrode is electrically floating. A gate dielectric layer is between and borders the internal gate electrode and the semiconductor channel. A control gate electrode is on an opposite side of the internal gate electrode as the semiconductor channel and is uncovered by the second source/drain region. A ferroelectric layer is between and borders the control gate electrode and the internal gate electrode.

20 Claims, 32 Drawing Sheets

(51) Int. Cl.
  *H10B 41/27* (2023.01)
  *H10B 41/35* (2023.01)
  *H10B 43/23* (2023.01)
  *H10B 51/20* (2023.01)
  *H10B 51/40* (2023.01)
  *H10B 51/50* (2023.01)

(52) U.S. Cl.
  CPC ............. *H10B 43/23* (2023.02); *H10B 51/20* (2023.02); *H10B 51/40* (2023.02); *H10B 51/50* (2023.02)

(56) References Cited

U.S. PATENT DOCUMENTS

| | | |
|---|---|---|
| 2014/0340952 A1 | 11/2014 | Ramaswamy et al. |
| 2016/0118404 A1 | 4/2016 | Peng |
| 2017/0069644 A1 | 3/2017 | Kikushima et al. |
| 2017/0194340 A1* | 7/2017 | Lue .................. H10B 43/27 |
| 2017/0373086 A1 | 12/2017 | Pang et al. |
| 2018/0006129 A1 | 1/2018 | Xing et al. |
| 2018/0277212 A1 | 9/2018 | Kim |
| 2019/0067488 A1 | 2/2019 | Tsai et al. |
| 2019/0198617 A1 | 6/2019 | Li et al. |
| 2019/0198673 A1 | 6/2019 | Liu et al. |
| 2019/0326357 A1* | 10/2019 | Castro .................. H10B 63/845 |
| 2020/0066867 A1 | 2/2020 | Cheng et al. |
| 2020/0066916 A1 | 2/2020 | Chen et al. |
| 2020/0105773 A1* | 4/2020 | Morris .................. G11C 5/025 |
| 2020/0194431 A1 | 6/2020 | Castro et al. |
| 2020/0212068 A1 | 7/2020 | Lee et al. |
| 2021/0126013 A1* | 4/2021 | Lai .................. H10B 51/20 |
| 2021/0202703 A1* | 7/2021 | Rajashekhar .......... H10B 51/20 |

OTHER PUBLICATIONS

Notice of Allowance dated Jun. 28, 2021 for U.S. Appl. No. 16/866,727.

* cited by examiner

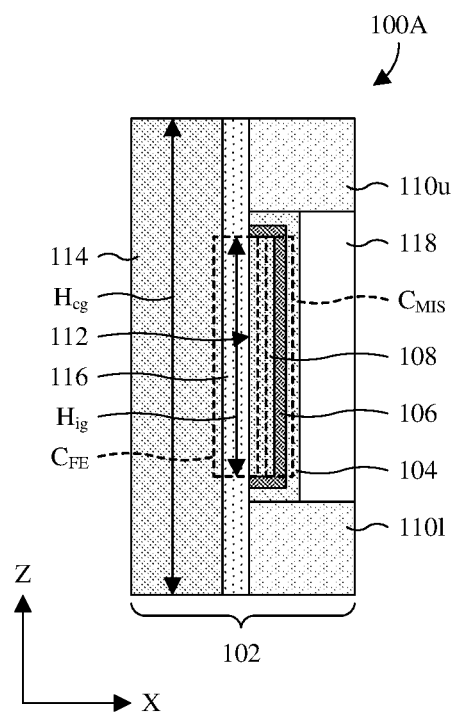
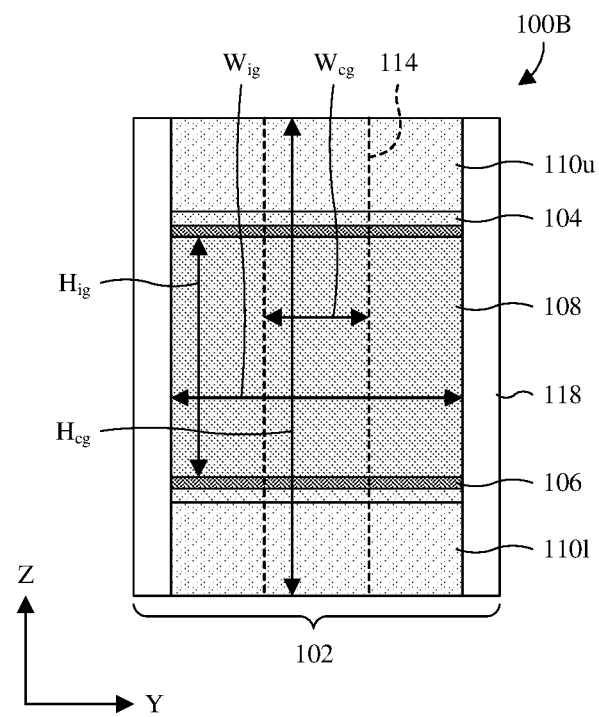
Fig. 1A
Fig. 1B
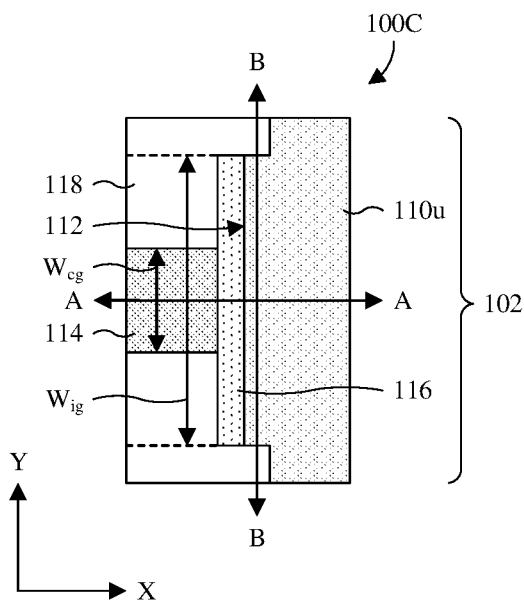
Fig. 1C

METHOD FOR FORMING A MFMIS MEMORY DEVICE

REFERENCE TO RELATED APPLICATIONS

This Application is a Divisional of U.S. application Ser. No. 16/866,727, filed on May 5, 2020, the contents of which are hereby incorporated by reference in their entirety.

BACKGROUND

Two-dimensional (2D) memory arrays are prevalent in electronic devices and may include, for example, NOR flash memory arrays, NAND flash memory arrays, dynamic random-access memory (DRAM) arrays, and so on. However, 2D memory arrays are reaching scaling limits and are hence reaching limits on memory density. Three-dimensional (3D) memory arrays are a promising candidate for increasing memory density and may include, for example, 3D NAND flash memory arrays, 3D NOR flash memory arrays, and so on.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1C illustrate various views of some embodiments of a MFMIS memory cell.

FIGS. 8A and 8B through FIGS. 15A and 15B, FIGS. 16A-16C, and FIGS. 17A and 17B illustrate a series of views of some embodiments of a method for forming an IC comprising a 3D memory array of MFMIS memory cells.

FIGS. 19A and 19B through 24A and 24B, FIGS. 25A-25C, and FIGS. 26A and 26B illustrate a series of views of some embodiments of a method for forming an IC comprising a 3D memory array of MFMIS memory cells in which word lines are respectively at a bottom of the 3D memory array and a top of the 3D memory array.

DETAILED DESCRIPTION

Figure 2A:
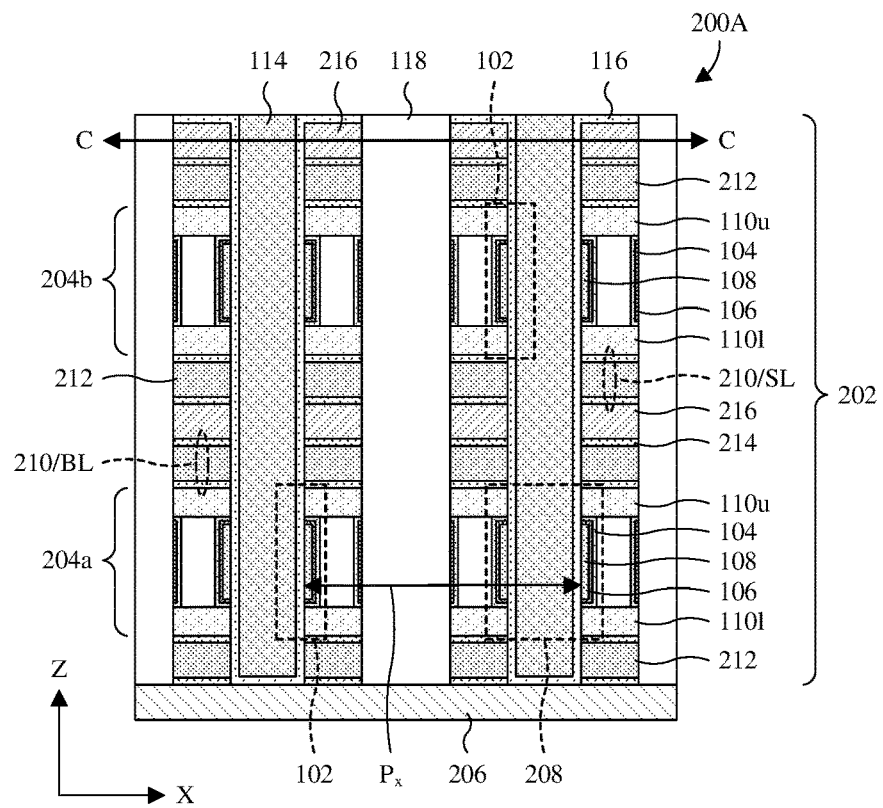
FIGS. 2A-2C illustrate various views of some embodiments of a three-dimensional (3D) memory array comprising MFMIS memory cells configured as in FIGS. 1A-1C.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a three-dimensional (3D) memory device comprises a plurality of metal-ferroelectric-insulator-semiconductor (MFIS) memory cells defining a plurality of memory arrays at different elevations. According to some embodiments of a MFIS memory cell in the 3D memory device, a first source/drain region, a semiconductor channel, and a second source/drain region are vertically stacked and define a common sidewall. A control gate electrode, a ferroelectric layer, and a gate dielectric layer extend vertically through the plurality of memory arrays along the common sidewall. The gate dielectric layer is between and borders the ferroelectric layer and the semiconductor channel, and the ferroelectric layer is between and borders the control gate electrode and the gate dielectric layer.

During program and erase operations, program and erase voltages having opposite polarities are respectively applied across the ferroelectric layer and the gate dielectric layer. The program and erase voltages change a polarity of the ferroelectric layer between a programmed state and an erased state, such that a bit of data may be represented by the polarity. Further, during program and erase operations, the MFIS memory cell may be modeled as a first parallel-plate capacitor and a second parallel-plate capacitor that are electrically coupled in series and that correspond to the ferroelectric layer and the gate dielectric layer.

A challenge with the MFIS memory cell is that the ferroelectric layer and the gate dielectric layer may share the same parallel plates (e.g., the control gate electrode and the semiconductor channel) and may hence have the same capacitor area. The capacitor area corresponds to the overlapping area between the control gate electrode and the semiconductor channel. Further, the ferroelectric layer may have a higher dielectric constant than the gate dielectric layer. For example, the ferroelectric layer may have a dielectric constant greater than about 20 or some other suitable value due to available materials, whereas the gate dielectric layer may have a dielectric constant between about 3.9-15 or some other suitable value for high reliability and a high time-dependent dielectric breakdown (TDDB).

For a pair of parallel-plate capacitors electrically coupled in series, the electric field ratio is equal to the inverse of the dielectric constant ratio times the inverse of the capacitor area ratio. In other words, $E_1/E_2=(k_2*A_2)/(k_1*A_1)$, where E denotes electric field, k denotes dielectric constant, A denotes capacitor area, and the subscript denotes a specific capacitor. Therefore, because of the same capacitor area and the higher dielectric constant at the ferroelectric layer, the gate dielectric layer and the ferroelectric layer may respectively have a high electric field and low electric field during program and erase operations.

Because of the low electric field across the ferroelectric layer, the polarization of the ferroelectric layer weakly switches during program and erase operations. As a result, the difference between readout currents while the ferroelectric layer is respectively at the programmed and erased states is small (e.g., the memory window is small). Further, because of the low electric field, the program and erase voltages may be high and hence power consumption may be high. Because of the high electric field at the gate dielectric layer, stress on the gate dielectric layer is high. This, in turn, degrades the reliability of the gate dielectric layer and the TDDB of the gate dielectric layer. Accordingly, the low electric field across the ferroelectric layer and the high electric field at the gate dielectric layer reduce the endurance of the MFIS memory cell and the retention of the MFIS memory cell.

Various embodiments of the present application are directed towards a metal-ferroelectric-metal-insulator-semiconductor (MFMIS) memory device, as well as a method for forming the MFMIS memory device. Note that although MFMIS stands for metal ferroelectric metal insulator semiconductor, doped polysilicon and other suitable conductive materials may be used in place of metal. According to some embodiments of the MFMIS memory device, a first source/drain region and a second source/drain region are vertically stacked. An internal gate electrode and a semiconductor channel overlie the first source/drain region and underlie the second source/drain region. The semiconductor channel extends from the first source/drain region to the second source/drain region, and the internal gate electrode is electrically floating. A gate dielectric layer is between and borders the internal gate electrode and the semiconductor channel. A control gate electrode is on an opposite side of the internal gate electrode as the semiconductor channel and is uncovered by the second source/drain region. A ferroelectric layer is between and borders the control gate electrode and the internal gate electrode.

During program and erase operations, the MFMIS memory cell may be modeled as a first parallel-plate capacitor and a second parallel-plate capacitor that are electrically coupled in series and that correspond to the ferroelectric layer and the gate dielectric layer. The control gate electrode and the internal gate electrode define parallel plates of the first capacitor, and the internal gate electrode and the semiconductor channel define parallel plates of the second capacitor. Hence, the capacitor area of the ferroelectric layer corresponds to the overlap between the control and internal gate electrodes, whereas the capacitor area of the gate dielectric layer corresponds to the overlap between the internal gate electrode and the semiconductor channel. Because of the internal gate electrode, the first and second parallel-plate capacitors each has a different set of parallel plates and may therefore have different capacitor areas. If the internal gate electrode was omitted, the first and second parallel-plate capacitors would have the same parallel plates and would therefore have the same capacitor areas.

As noted above, for a pair of parallel-plate capacitors electrically coupled in series, the electric field ratio is equal to the inverse of the dielectric constant ratio times the inverse of the capacitor area ratio. Tuning the electric fields across the ferroelectric layer and the gate dielectric layer using dielectric constants may be difficult due to material constraints. However, tuning the electric fields across the ferroelectric layer and the gate dielectric layer using capacitor area may be achieved during formation of the MFMIS memory cell by tuning the dimensions respectively of the control gate electrode, the internal gate electrode, and the semiconductor channel. Therefore, the dimensions may be tuned so the electric field across the ferroelectric layer is high and the electric field across the gate dielectric layer is low.

Because the ferroelectric layer may have a high electric field, the polarization of the ferroelectric layer may strongly switch during program and erase operations. As a result, the difference between readout currents while the ferroelectric layer is respectively at programmed and erased states may be large (e.g., the memory window may be large). Further, because the ferroelectric layer may have a high electric field, program and erase voltages may be low and hence power consumption may be low. Because of the low electric field at the gate dielectric layer, stress on the gate dielectric layer may be low. This, in turn, may improve the reliability of the gate dielectric layer and the TDDB of the gate dielectric layer. Accordingly, tuning the dimensions of the control and internal gate electrodes may enhance the endurance of the MFMIS memory cell and the retention of the MFMIS memory cell.

With reference to FIGS. 1A-1C, various views 100A-100C of some embodiments of a MFMIS memory cell 102 is provided. FIG. 1A corresponds to a cross-sectional view 100A along line A in FIG. 1C, whereas FIG. 1B corresponds to a cross-sectional view 100B along line B in FIG. 1C. Further, FIG. 1C corresponds to a top view 100C. The MFMIS memory cell 102 may, for example, be or comprise a MFMIS field-effect transistor (FET) or some other suitable semiconductor device having an MFMIS stack.

A semiconductor channel 104, a gate dielectric layer 106, and an internal gate electrode 108 overlie a lower source/drain region 110$l$ and underlie an upper source/drain region 110$u$. The semiconductor channel 104, the gate dielectric layer 106, the internal gate electrode 108, lower source/drain region 110$l$, and the upper source/drain region 110$u$ define a common sidewall 112 facing a control gate electrode 114 and a ferroelectric layer 116. In some embodiments, the common sidewall 112 is flat and/or smooth. The control gate electrode 114 and the ferroelectric layer 116 extend along the common sidewall 112 from a bottom surface of the lower source/drain region 110$l$ to a top surface of the upper source/drain region 110$u$.

The ferroelectric layer 116 separates the control gate electrode 114 from the common sidewall 112 and has a polarity representing a bit of data. During program and erase operations, the lower and upper source/drain regions 110$l$, 110$u$ are electrically coupled in parallel and used as a proxy for the semiconductor channel 104. A program voltage is applied from the control gate electrode 114 to semiconductor channel 104 (e.g., via the lower and upper source/drain regions 110$l$, 110$u$) to set the polarity to a programmed state. Further, an erase voltage having an opposite polarity as the program voltage is applied from the control gate electrode 114 to the semiconductor channel 104 (e.g., via the lower and upper source/drain regions 110*l*, 110*u*) to set the polarity to an erased state. The programmed state may, for example, represent a binary "1", whereas the erased state may, for example, represent a binary "0", or vice versa.

The ferroelectric layer 116 screens an electric field produced by the control gate electrode 114 such that MFMIS memory cell 102 has a programmed threshold voltage and an erased threshold voltage respectively while the polarity is in the programmed state and the erased state. Hence, during read operations, the control gate electrode 114 is biased with a read voltage between the programmed and erased threshold voltages and the resistance of the semiconductor channel 104 is measured. Depending upon whether the semiconductor channel 104 conducts, the polarity is either in the programmed or erased state.

Because the lower and upper source/drain regions 110*l*, 110*u* are electrically coupled in parallel during program and erase operations, the MFMIS memory cell 102 may be modeled as a metal-insulator-semiconductor (MIS) parallel-plate capacitor $C_{MIS}$ (MIS capacitor $C_{MIS}$ for short) and a ferroelectric parallel-plate capacitor $C_{FE}$ (ferroelectric capacitor $C_{FE}$ for short) that are electrically coupled in series during program and erase operations. The internal gate electrode 108 and the semiconductor channel 104 respectively define parallel plates of the MIS capacitor $C_{MIS}$ that are parallel to the cross-sectional view 100B of FIG. 1B, and the gate dielectric layer 106 defines an insulator of the MIS capacitor $C_{MIS}$. In some embodiments, an interfacial layer (not shown) on the semiconductor channel 104, between the gate dielectric layer 106 and the semiconductor channel 104, also defines the insulator of the MIS capacitor $C_{MIS}$. Further, the internal and control gate electrodes 108, 114 respectively define parallel plates of the ferroelectric capacitor $C_{FE}$ that are parallel to the cross-sectional view 100B of FIG. 1B, and the ferroelectric layer 116 defines an insulator of the ferroelectric capacitor $C_{FE}$.

A capacitor area of a parallel plate capacitor corresponds to the overlap between opposing surfaces respectively of the parallel plates when the opposing surfaces are projected onto a two-dimensional (2D) plane that is parallel to the opposing surfaces. Therefore, the capacitor area of the MIS capacitor $C_{MIS}$ corresponds to the overlap between opposing surfaces respectively of the internal gate electrode 108 and the semiconductor channel 104 when the opposing surfaces are projected onto a 2D plane that is parallel to the opposing surfaces. Similarly, the capacitor area of the ferroelectric capacitor $C_{FE}$ corresponds to the overlap between opposing surfaces respectively of the internal and control gate electrodes 108, 114 when the opposing surfaces are projected onto a 2D plane that is parallel to the opposing surfaces.

Because of the internal gate electrode 108, the ferroelectric and MIS capacitors $C_{FE}$, $C_{MIS}$ may have different capacitor areas. If the internal gate electrode 108 was omitted, the ferroelectric and MIS capacitors $C_{FE}$, $C_{MIS}$ would share the same parallel plates and would therefore have the same capacitor areas. Further, as seen hereafter, the MFMIS memory cell 102 may be formed by a method that allows a width $W_{cg}$ of the control gate electrode 114 and a width $W_{ig}$ of the internal gate electrode 108 to be independently defined. This, in turn, allows tuning of the capacitor areas of the ferroelectric and MIS capacitors $C_{FE}$, $C_{MIS}$.

Because the ferroelectric and MIS capacitors $C_{FE}$, $C_{MIS}$ are electrically coupled in series, an electric field ratio (e.g., $E_{FE}/E_{MIS}$) for the ferroelectric and MIS capacitors $C_{FE}$, $C_{MIS}$ is equal to the inverse of the dielectric constant ratio (e.g., $k_{MIS}/k_{FE}$) times the inverse of the capacitor area ratio (e.g., $A_{MIS}/A_{FE}$). In other words, $E_{FE}/E_{MIS}=(k_{MIS}*A_{MIS})/(k_{FE}*A_{FE})$, where E denotes electric field, k denotes dielectric constant, A denotes capacitor area, and the subscript denotes a specific capacitor (e.g., $C_{FE}$ or $C_{MIS}$). Accordingly, the electric field ratio may be tuned by the dielectric constant ratio and/or the capacitor area ratio.

A dielectric constant is a material dependent parameter, such that material constraints may limit the ability to tune the electric field ratio (e.g., $E_{FE}/E_{MIS}$) based on the dielectric constant ratio (e.g., $k_{MIS}/k_{FE}$). For example, the ferroelectric layer 116 may have a dielectric constant greater than about 20 or some other suitable value due to available materials, whereas the gate dielectric layer 106 may have a dielectric constant between about 3.9-15 or some other suitable value for high reliability and a high TDDB. However, as noted above, capacitor areas may be tuned by a method for forming the MFMIS memory cell 102. Hence, the electric field ratio (e.g., $E_{FE}/E_{MIS}$) may be tuned based on the capacitor area ratio (e.g., $A_{MIS}/A_{FE}$) during the method for forming the MFMIS memory cell 102.

Because the electric field ratio (e.g., $E_{FE}/E_{MIS}$) may be tuned during the method for forming the MFMIS memory cell 102, the ferroelectric layer 116 may have a high electric field during program and erase operations while the gate dielectric layer 106 may have a low electric field during program and erase operations. Further, the ferroelectric layer 116 may have a high voltage drop during program and erase operations while the gate dielectric layer 106 may have a low voltage drop during program and erase operations. Because the ferroelectric layer 116 may have a high electric field, the polarization of the ferroelectric layer 116 may strongly switch during program and erase operations. As a result, the difference between readout currents while the ferroelectric layer 116 is respectively at programmed and erased states may be large (e.g., the memory window may be large). Further, because the ferroelectric layer 116 may have a high electric field, program and erase voltages may be low and hence power consumption may be low. Because the gate dielectric layer 106 may have a low electric field, stress on the gate dielectric layer 106 may be low. This, in turn, may improve the reliability of the gate dielectric layer 106 and the TDDB of the gate dielectric layer 106. Accordingly, the endurance of the MFMIS memory cell 102 and the retention of the MFMIS memory cell 102 may be enhanced.

Referring specifically to FIG. 1B, the internal gate electrode 108 completely overlaps with the semiconductor channel 104, such that a surface area of the internal gate electrode 108 defines the capacitor area of the MIS capacitor $C_{MIS}$. Further, a height $H_{ig}$ of the internal gate electrode 108 is less than a height $H_{cg}$ of the control gate electrode 114, and the width $W_{cg}$ of the control gate electrode 114 is less than the width $W_{ig}$ of the internal gate electrode 108, such that the capacitor area of the ferroelectric capacitor $C_{FE}$ is bounded by the width $W_{cg}$ of the control gate electrode 114 and the height $H_{ig}$ of the internal gate electrode 108. Accordingly, the MIS and ferroelectric capacitors $C_{MIS}$, $C_{FE}$ have the same capacitor area height, and the ferroelectric capacitor $C_{FE}$ has a lesser capacitor area width than the MIS capacitor $C_{MIS}$.

Because the ferroelectric and MIS capacitors have the same capacitor area height, the electric field ratio (e.g., $E_{FE}/E_{MIS}$) may be simplified and equal to $(k_{MIS}*W_{MIS})/(k_{FE}*W_{FE})$, where $W_{FE}$ is the width $W_{cg}$ of the control gate electrode 114 and $W_{MIS}$ is the width $W_{ig}$ of the internal gate electrode 108. Further, because the MIS and ferroelectric capacitors $C_{MIS}$, $C_{FE}$ have the same capacitor area heights, and the ferroelectric capacitor $C_{FE}$ has a lesser capacitor area width than the MIS capacitor $C_{MIS}$, the capacitor area of the ferroelectric capacitor $C_{FE}$ is less than the capacitor area of the MIS capacitor $C_{MIS}$. Hence, the capacitor area ratio (e.g., $A_{MIS}/A_{FE}$) favors a higher electric field at the ferroelectric layer 116 than at the gate dielectric layer 106. As noted above, a higher electric field at the ferroelectric layer 116 enhances the endurance of the MFMIS memory cell 102 and the retention of the MFMIS memory cell 102.

Referring generally back to FIGS. 1A-1C, the semiconductor channel 104 extends from the lower source/drain region 110l to the upper source/drain region 110u. Further, the semiconductor channel 104 wraps around corners of the gate dielectric layer 106 from a sidewall of the gate dielectric layer 106 respectively to a top surface of the gate dielectric layer 106 and a bottom surface of the gate dielectric layer 106. In some embodiments, the semiconductor channel 104 has a reverse C-shaped profile. However, other suitable profiles are amenable. The semiconductor channel 104 may, for example, be doped or undoped and may, for example, be or comprise polysilicon and/or some other suitable semiconductor material(s).

The lower and upper source/drain regions 110l, 110u are doped and may, for example, be or comprise polysilicon and/or some other suitable semiconductor material(s). In some embodiments, the lower and upper source/drain regions 110l, 110u are or comprise doped polysilicon with a first doping type, and the semiconductor channel 104 is or comprises doped polysilicon with a second doping type opposite the first doping type. In some other embodiments, the lower and upper source/drain regions 110l, 110u are or comprise doped polysilicon, and the semiconductor channel 104 is or comprises undoped polysilicon.

The gate dielectric layer 106 wraps around corners of the internal gate electrode 108 from a sidewall of the internal gate electrode 108 respectively to a top surface of the internal gate electrode 108 and a bottom surface of the internal gate electrode 108. In some embodiments, the gate dielectric layer 106 has a reverse C-shaped profile. However, other suitable profiles are amenable. The gate dielectric layer 106 may be or comprise, for example, silicon oxide (e.g., $SiO_2$), silicon nitride (e.g., $Si_3N_4$), silicon oxynitride (e.g., SiON), aluminum oxide (e.g., $Al_2O_3$), hafnium oxide (e.g., $HfO_2$), lanthanum oxide (e.g., $La_2O_3$), zirconium oxide (e.g., $ZrO_2$), some other suitable dielectric(s), or any combination of the foregoing.

In some embodiments, the gate dielectric layer 106 has a dielectric constant less than that of the ferroelectric layer 116, such that the dielectric constant ratio (e.g., $k_{MIS}/k_{FE}$) favors a higher electric field at the gate dielectric layer 106 than at the ferroelectric layer 116 during program and erase operations. As noted above, this may degrade endurance and/or retention of the MFMIS memory cell 102. Therefore, in some of such embodiments, the capacitor area ratio (e.g., $A_{MIS}/A_{FE}$) is tuned to counteract the dielectric constant ratio (e.g., $k_{MIS}/k_{FE}$) so the ferroelectric layer 116 has a higher electric field than the gate dielectric layer 106 during program and erase operations. In some embodiments, the gate dielectric layer 106 is or comprises a high k dielectric material having a dielectric constant greater than about 3.9 or some other suitable value. In some embodiments, the gate dielectric layer 106 has a dielectric constant between about 3.9-15 or some other suitable value. If the dielectric constant is greater than about 15 or some other suitable value, leakage current may be high and/or reliability of the gate dielectric layer 106 may be low. For example, a TDDB of the gate dielectric layer 106 may be low. If the dielectric constant is less than about 3.9 or some other suitable value, the dielectric constant ratio (e.g., $k_{MIS}/k_{FE}$) may favor a higher electric field at the gate dielectric layer 106 than at the ferroelectric layer 116 to such an extent that it may be difficult to compensate for the higher electric field using the capacitor area ratio (e.g., $A_{MIS}/A_{FE}$).

The internal gate electrode 108 is electrically floating and may, for example, be or comprise titanium nitride, doped polysilicon (e.g., N+ or P+), tantalum nitride, tungsten, some other suitable conductive material(s), or any combination of the foregoing. In some embodiments, the internal gate electrode 108, the gate dielectric layer 106, and the semiconductor channel 104 completely underlie the upper source/drain region 110u and/or completely overlie the lower source/drain region 110l.

The control gate electrode 114 and the ferroelectric layer 116 are on an opposite side of the floating gate electrode 108 as the gate dielectric layer 106 and the semiconductor channel 104. Further, the control gate electrode 114 and the ferroelectric layer 116 are at sides of the lower and upper source/drain regions 110l, 110u. As such, the control gate electrode 114 and the ferroelectric layer 116 are uncovered by the upper source/drain region 110u. The control gate electrode 114 may, for example, be or comprise titanium nitride, doped polysilicon (e.g., N+ or P+), tantalum nitride, tungsten, some other suitable conductive material(s), or any combination of the foregoing. The ferroelectric layer 116 may, for example, be or comprise hafnium oxide (e.g., $HfO_2$) doped with: 1) aluminum to less than about 20 atomic percent; 2) silicon to less than about 5 atomic percent; 3) zirconium to less than about 50 atomic percent; 4) lanthanum to less than about 50 atomic percent; 5) strontium to less than about 50 atomic percent; or 6) some other suitable element. Additionally, or alternatively, the ferroelectric layer 116 may, for example, be or comprise some other suitable ferroelectric material(s).

The ferroelectric layer 116, the semiconductor channel 104, the gate dielectric layer 106, and the internal gate electrode 108 have individual thicknesses laterally (e.g., in an X direction) within the cross-sectional view of FIG. 1A. The ferroelectric layer 116 may, for example, have an individual thickness of about 3-15 nanometers. The semiconductor channel 104 may, for example, have an individual thickness of about 5-7 nanometers or some other suitable thickness. The gate dielectric layer 106 may, for example, have an individual thickness of about 1-5 nanometers or some other suitable thickness. The internal gate electrode 108 may, for example, have an individual thickness of about 4-24 nanometers or some other suitable thickness. The semiconductor channel 104, the gate dielectric layer 106, and the internal gate electrode 108 may, for example, have a combined thickness of about 10-30 nanometers.

A dielectric structure 118 surrounds the MFMIS memory cell 102. The dielectric structure 118 separates the lower and upper source/drain regions 110l, 110u from each other and, as seen hereafter, separates the MFMIS memory cell 102 from other MFMIS memory cells when the MFMIS memory cell 102 is integrated into a memory array. Note that a portion of the dielectric structure 118 separating the lower and upper source/drain regions 110l, 110u may also be known as a source/drain dielectric layer. The dielectric structure 118 may be or comprise, for example, silicon oxide and/or some other suitable dielectric(s).

Figure 2B:
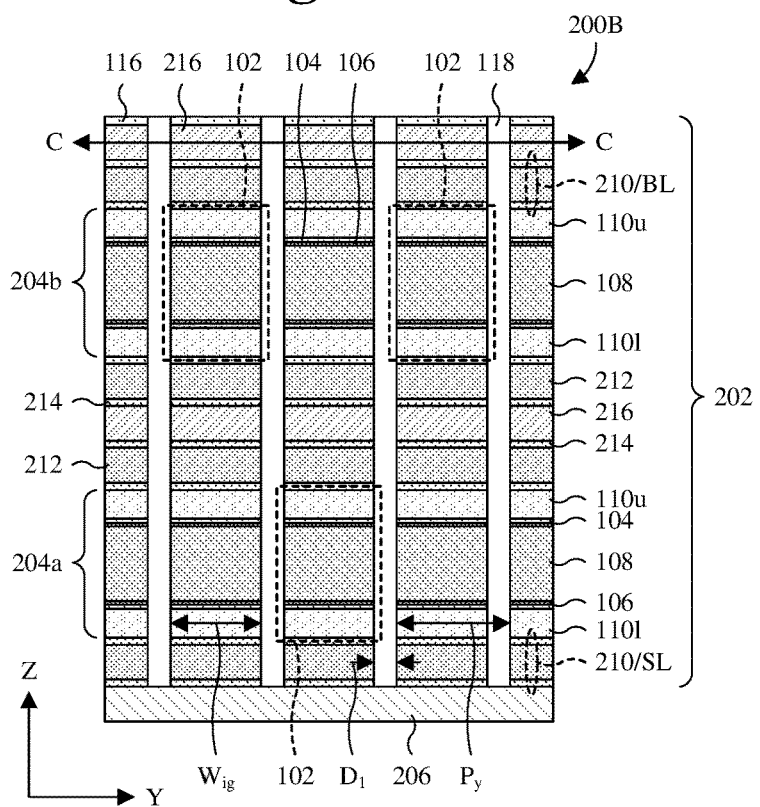
Figure 2C:
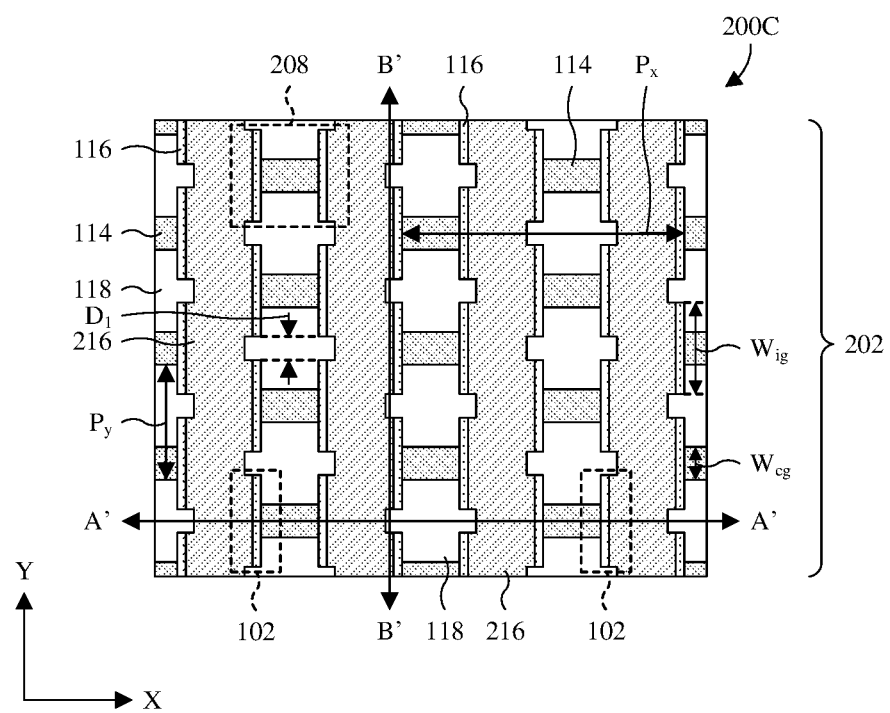

With reference to FIGS. 2A-2C, various views 200A-200C of some embodiments of a 3D memory array 202 comprising a plurality of MFMIS memory cells 102 configured as in FIGS. 1A-1C is provided. FIG. 2A corresponds to a cross-sectional view 200A along line A' in FIG. 2C. FIG. 2B corresponds to a cross-sectional view 200B along line B' in FIG. 2C. FIG. 2C corresponds to a top view 200C along line C in FIGS. 2A and 2B. The 3D memory array 202 may, for example, provide high memory density, as well as high reliability (e.g., high endurance and high retention) for high speed and low power consumption applications.

The MFMIS memory cells 102 are grouped into a first memory array 204a and a second memory array 204b. The first and second memory arrays 204a, 204b are vertically stacked over a dielectric substrate 206, and the second memory array 204b overlies the first memory array 204a. The first and second memory arrays 204a, 204b have the same layout and each has 9 rows and 8 columns. In alternative embodiments, the first and second memory arrays 204a, 204b may have more or less rows and/or more or less columns. For readability, the rows and the columns are not labeled. However, it is to be appreciated that the rows extend in an X direction (e.g., laterally in the cross-sectional view 200A of FIG. 2A), whereas the columns extend in a Y direction (e.g., laterally in the cross-sectional view 200B of FIG. 2B).

A plurality of control gate electrodes 114 and a ferroelectric layer 116 extend through the first and second memory arrays 204a, 204b and partially define the MFMIS memory cells 102. Further, the control gate electrodes 114 and the ferroelectric layer 116 are shared by MFMIS memory cells in the first memory array 204a and MFMIS memory cells in the second memory array 204b. For example, each MFMIS memory cell in the first memory array 204a may share a control gate electrode and the ferroelectric layer 116 with an overlying MFMIS memory cell in the second memory array 204b. The ferroelectric layer 116 may, for example, be shared by multiple MFMIS memory cells because polarization of the ferroelectric layer 116 is localized to a MFMIS memory cell at which the polarization occurred.

The MFMIS memory cells 102 are further grouped into pairs 208 of neighboring MFMIS memory cells (e.g., MFMIS pairs 208) along corresponding rows. The MFMIS memory cells in each of the MFMIS pairs 208 share a corresponding one of the control gate electrodes 114. A MFMIS memory cell on a right side of a corresponding control gate electrode is as illustrated and described in FIGS. 1A-1C. A MFMIS memory cell on a left side of a corresponding control gate electrode is as illustrated and described in FIGS. 1A-1C, except that FIG. 1A should be flipped horizontally along the Z axis and FIG. 1C should be flipped horizontally along the Y axis. FIG. 1B is the same regardless of whether an MFMIS memory cell is on a left or right side of a corresponding control gate electrode.

The MFMIS pairs 208 are arranged so an MFMIS pair occurs every two columns along each row and occurs every other row along each column. Further, the MFMIS pairs 208 are staggered along neighboring columns and neighboring rows so a pitch $P_y$ of the MFMIS pairs 208 in a Y direction spans a row and a pitch $P_x$ of the MFMIS pairs 208 in an X direction spans two columns. In some embodiments, the control gate electrodes 114 have individual widths $W_{cg}$ in the Y direction that are less than about half the Y-direction pitch $P_y$.

A plurality of semiconductor channels 104, a plurality of gate dielectric layers 106, a plurality of lower source/drain regions 110l, and a plurality of upper source/drain regions 110u partially define the MFMIS memory cells 102. Note that "lower" and "upper" are relative to the corresponding MFMIS memory cells 102 for the lower and upper source/drain regions 110l, 110u. The semiconductor channels 104, the gate dielectric layers 106, and the lower and upper source/drain regions 110l, 110u extend correspondingly along the columns and are shared by the MFMIS memory cells in the corresponding columns. A semiconductor channel may, for example, be shared by multiple MFMIS memory cells because an electric field produced by an MFMIS memory cell is localized to the MFMIS memory cell. In alternative embodiments, the semiconductor channels 104 and/or the gate dielectric layers 106 are individual to the MFMIS memory cells 102 and are hence not shared by MFMIS memory cells.

A plurality of internal gate electrodes 108 partially define the MFMIS memory cells 102. The internal gate electrodes 108 are individual to the MFMIS memory cells 102 and are therefore not shared by MFMIS memory cells. In some embodiments, the internal gate electrodes 108 are separated from each other along corresponding columns by a distance Di that is less than about half the Y-direction pitch $P_y$.

As discussed with regard to FIGS. 1A-1C, the internal gate electrodes 108 may be used to tune the electric fields across the gate dielectric and ferroelectric layers 106, 116 so the ferroelectric layers 116 have higher electric fields than the gate dielectric layers 106 during program and erase operations. For example, the internal gate electrodes 108 may have individual widths $W_{ig}$ greater than the individual widths $W_g$ of the control gate electrodes 114 to promote higher electric fields at the ferroelectric layers 116 than at the gate dielectric layers 106. Higher electric fields at the ferroelectric layers 116 than at the gate dielectric layers 106 may enhance endurance and/or retention of the MFMIS memory cells 102.

A plurality of metal lines 210 define bit lines BL and source lines SL. The bit lines BL extend respectively along the columns and are respectively on and electrically coupled to top surfaces of the upper source/drain regions 110u. The source lines SL extend respectively along the columns and are respectively on and electrically coupled to bottom surfaces of the lower source/drain regions 110l. In alternative embodiments, the bit lines BL and the source lines SL are reversed. The metal lines 210 have smaller resistances than the lower and upper source/drain regions 110l, 110u and are defined by corresponding metal layers 212 and corresponding barrier layers 214. The barrier layers 214 are configured to prevent diffusion of material from the metal layers 212 to overlying and/or underlying structure. The metal layers 212 may, for example, be or comprise tungsten and/or some other suitable metal(s). The barrier layers 214 may, for example, be or comprise titanium nitride (e.g., TiN), tungsten nitride (e.g., WN), some other suitable barrier material(s), or any combination of the foregoing.

Multiple array dielectric layers 216 respectively overlie the first and second memory arrays 204a, 204b atop the bit lines BL. The array dielectric layers 216 are a different material than the dielectric substrate 206 and may, for example, be or comprise silicon nitride and/or some other suitable dielectric(s). A dielectric structure 118 surrounds the MFMIS memory cells 102 and separates the MFMIS memory cells 102 from each other. Further, the dielectric structure 118 separates the lower and upper source/drain regions 110l, 110u from each other.

While FIGS. 2A-2C illustrate a 3D memory array with two memory-array levels, more memory-array levels are amenable. For example, the second memory array 204b along with its corresponding metal lines and its corresponding array dielectric layer may be repeated above the second memory array 204b. Further, while FIGS. 2A-2C illustrate a 3D memory array with two memory-array levels, a two-dimensional (2D) memory array with a single memory-array level is also amenable. For example, the second memory array 204b along with its corresponding metal lines and its corresponding array dielectric layer may be omitted.

Figure 3A:
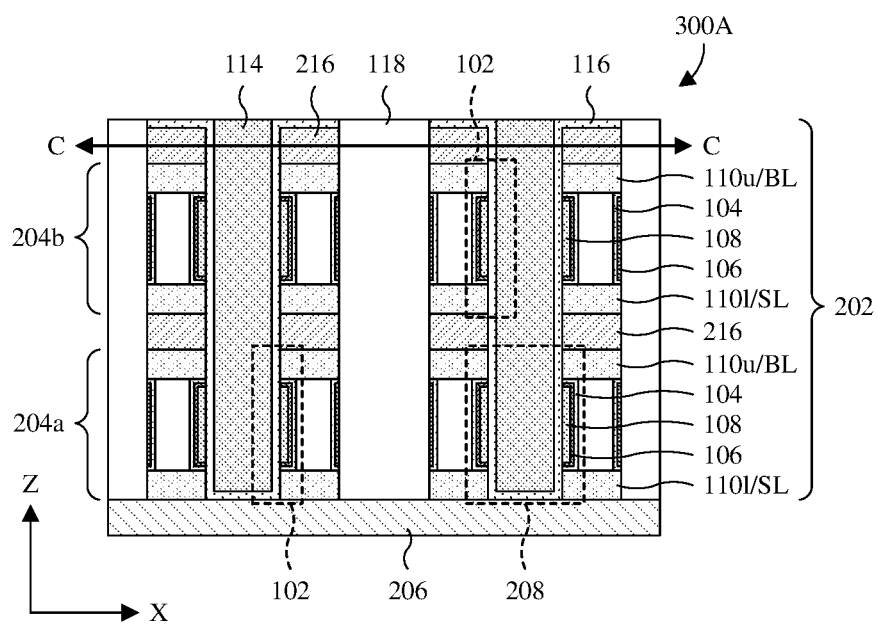
FIGS. 3A-3E illustrate cross-sectional views of various alternative embodiments of the 3D memory array of FIGS. 2A-2C.

With reference to FIG. 3A, a cross-sectional view 300A of some alternative embodiments of the 3D memory array of FIG. 2A is provided in which the metal lines 210 are omitted. As such, the lower source/drain regions 110l serves as the source lines SL and the upper source/drain regions 110u serve as the bit lines BL. While this may reduce material costs and/or manufacturing complexity, it may come at the cost of increased voltage drops along the source lines SL and the bit lines BL because the lower and upper source/drain regions 110l, 110u may have higher resistances than the metal lines 210. Such increased voltage drops may limit the size of the 3D memory array and/or lead to increased power consumption.

Figure 3B:
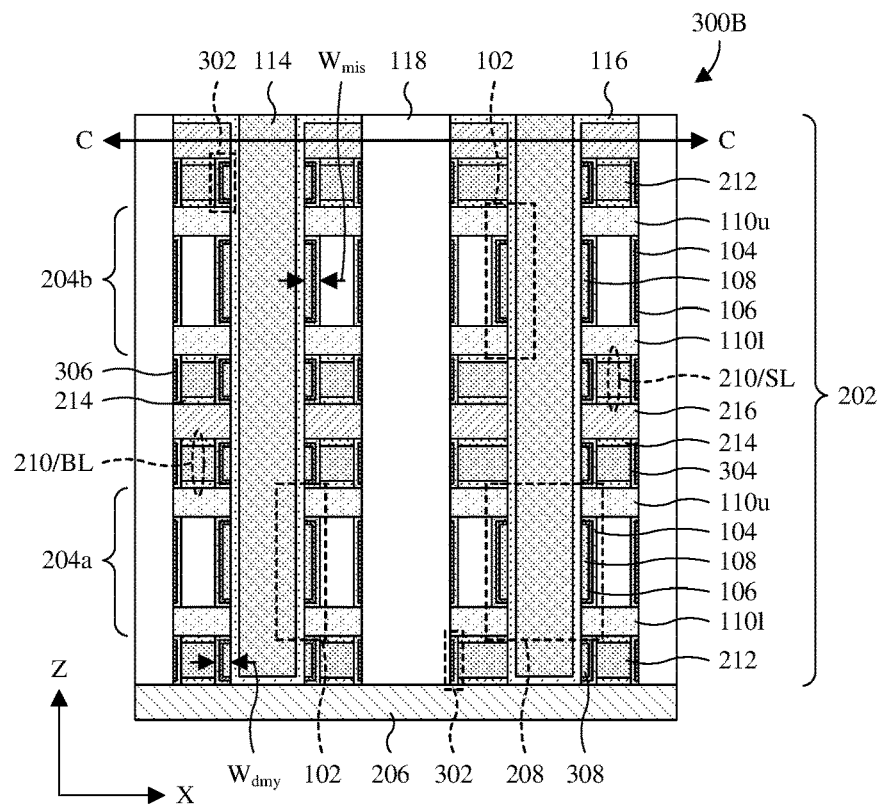

With reference to FIG. 3B, a cross-sectional view 300B of some alternative embodiments of 3D memory array of FIG. 2A is provided in which dummy structures 302 are on sidewalls of the metal lines 210 to protect the metal lines 210 from oxidation. Such oxidation may, for example, occur before and/or during deposition of ferroelectric material from which the ferroelectric layer 116 is formed. Oxidation may increase resistances of the metal lines 210, thereby increasing voltage drops along the metal lines 210. This may, in turn, increase power consumption and/or limit the size of the 3D memory array. Further, if the oxidation is substantial enough, device failure may occur.

The dummy structures 302 comprise corresponding dummy semiconductor channels 304, corresponding dummy gate dielectric layers 306, and corresponding dummy internal gate electrodes 308. The dummy semiconductor channels 304, the dummy gate dielectric layers 306, and the dummy internal gate electrodes 308 are respectively as the semiconductor channels 104, the gate dielectric layers 106, and the internal gate electrodes 108 are described. This may, for example, be due to formation by the same process or a similar process.

In some embodiments, the dummy structures 302 have individual widths $W_{dmy}$ that are the same as or substantially the same as individual widths $W_{mis}$ of corresponding MIS structures defined by the semiconductor channels 104, the gate dielectric layers 106, and the internal gate electrodes 108. In alternative embodiments, the dummy structures 302 have individual widths $W_{dmy}$ that are different (e.g., greater or less) than the individual widths $W_{mis}$ of the corresponding MIS structures defined by the semiconductor channels 104, the gate dielectric layers 106, and the internal gate electrodes 108. The different widths may, for example, be due to different etch processes while forming recesses within which the dummy structures 302 and the MIS structures are formed and/or may, for example, be due to different etch rates while forming the recesses. Other suitable reasons are, however, amenable for the different widths.

Figure 3C:
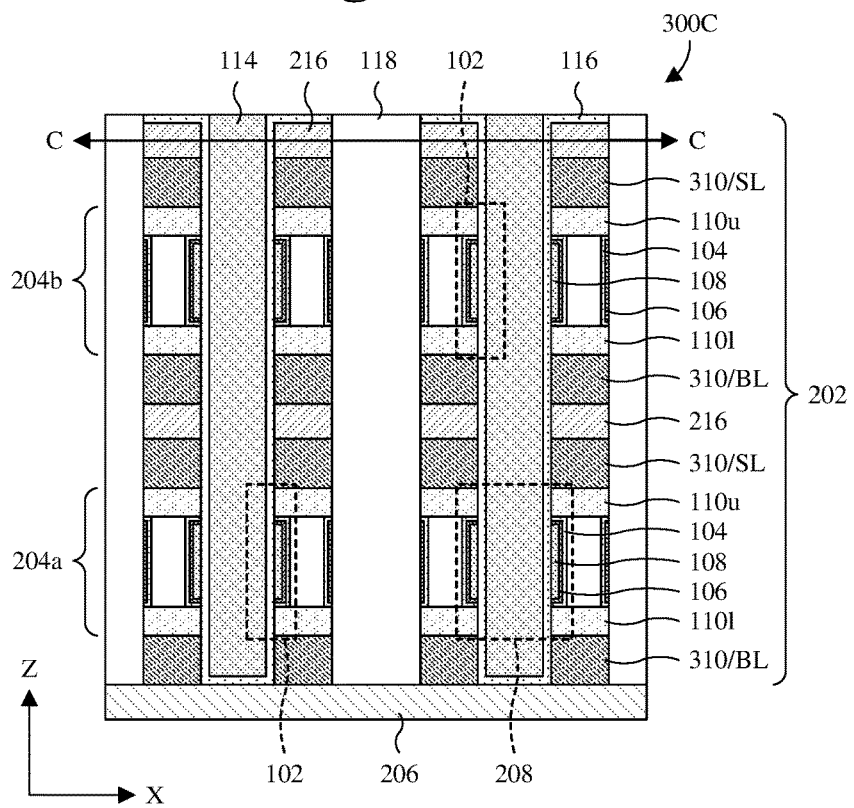

With reference to FIG. 3C, a cross-sectional view 300C of some alternative embodiments of the 3D memory array of FIG. 2A is provided in which a plurality of silicide lines 310 are used in place of the plurality of metal lines 210. Hence, the source lines SL and the bit lines BL are defined by the silicide lines 310.

As discussed with regard to FIG. 3B, oxidation of the metal lines 210 may occur without dummy structures 302 protecting sidewalls of the metal lines 210. Such oxidation may, in turn, negatively impact performance of the 3D memory array. The silicide lines 310 may have a comparable resistance to the metal lines 210 and may hence perform comparable to the metal lines 210. Further, the silicide lines 310 may have a lower reactivity to oxygen than the metal lines 210. Therefore, by replacing the metal lines 210 with the silicide lines 310, the challenges associated with oxidation may be mitigated without the dummy structures 302. Further yet, the dummy structures 302 may add complexity to formation of the 3D memory array, such that omitting the dummy structures 302 may reduce costs and/or increase yields.

Figure 3D:
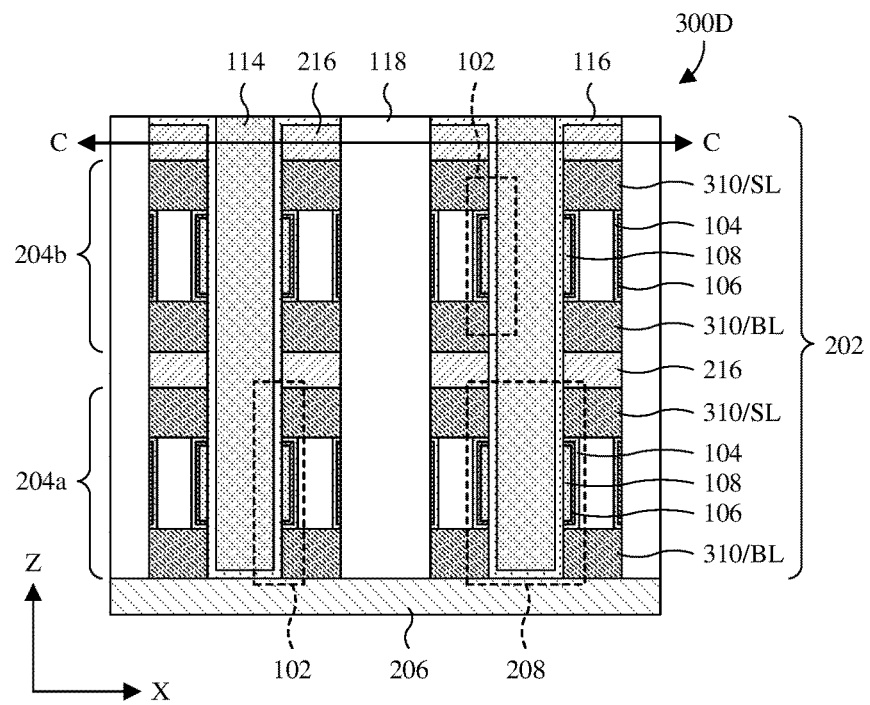

With reference to FIG. 3D, a cross-sectional view 300D of some alternative embodiments of the 3D memory array of FIG. 3C is provided in which the lower and upper source/drain regions 110l, 110u are omitted. Instead, the silicide lines 310 are used as source/drain regions for the MFMIS memory cells 102.

Figure 3E:
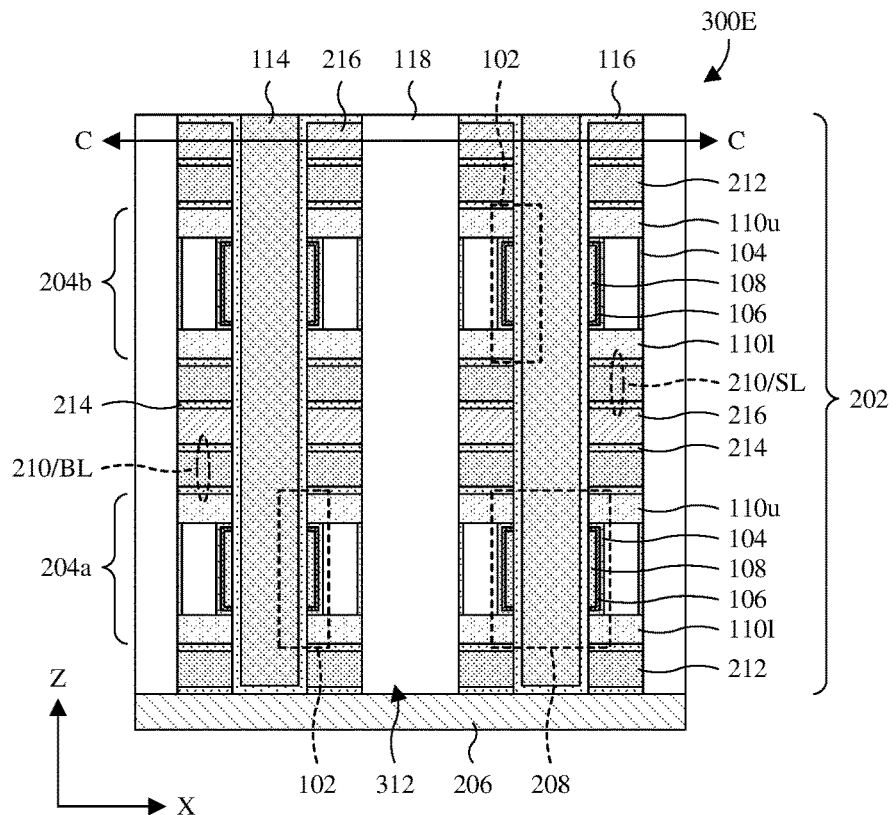

With reference to FIG. 3E, a cross-sectional view 300E of some alternative embodiments of the 3D memory array of FIG. 2A is provided in which the gate dielectric layers 106 are individual to the MFMIS memory cells 102 and hence are not shared by MFMIS memory cells along corresponding columns. As a result, gate dielectric layers are no longer visible at gaps 312 between the MFMIS pairs 208. In alternative embodiments, the semiconductor channels 104 are also individual to the MFMIS memory cells 102 and would hence not be visible at the gaps 312 between the MFMIS pairs 208.

While FIGS. 3A-3E illustrate cross-sectional views 300A-300E of some alternative embodiments of the 3D memory array of FIG. 2A in an X direction, it is to be appreciated that top views of the alternative embodiments may be as illustrated in FIG. 2C. For example, FIG. 2C may be taken along line C in any one of the FIGS. 3A-3E. Similarly, it is to be appreciated that cross-sectional views of the alternative embodiments in a Y direction may be as illustrated in FIG. 2B, except that the vertical stacks of layers would be modified to match FIGS. 3A-3E.

Figures 4A, 4B:
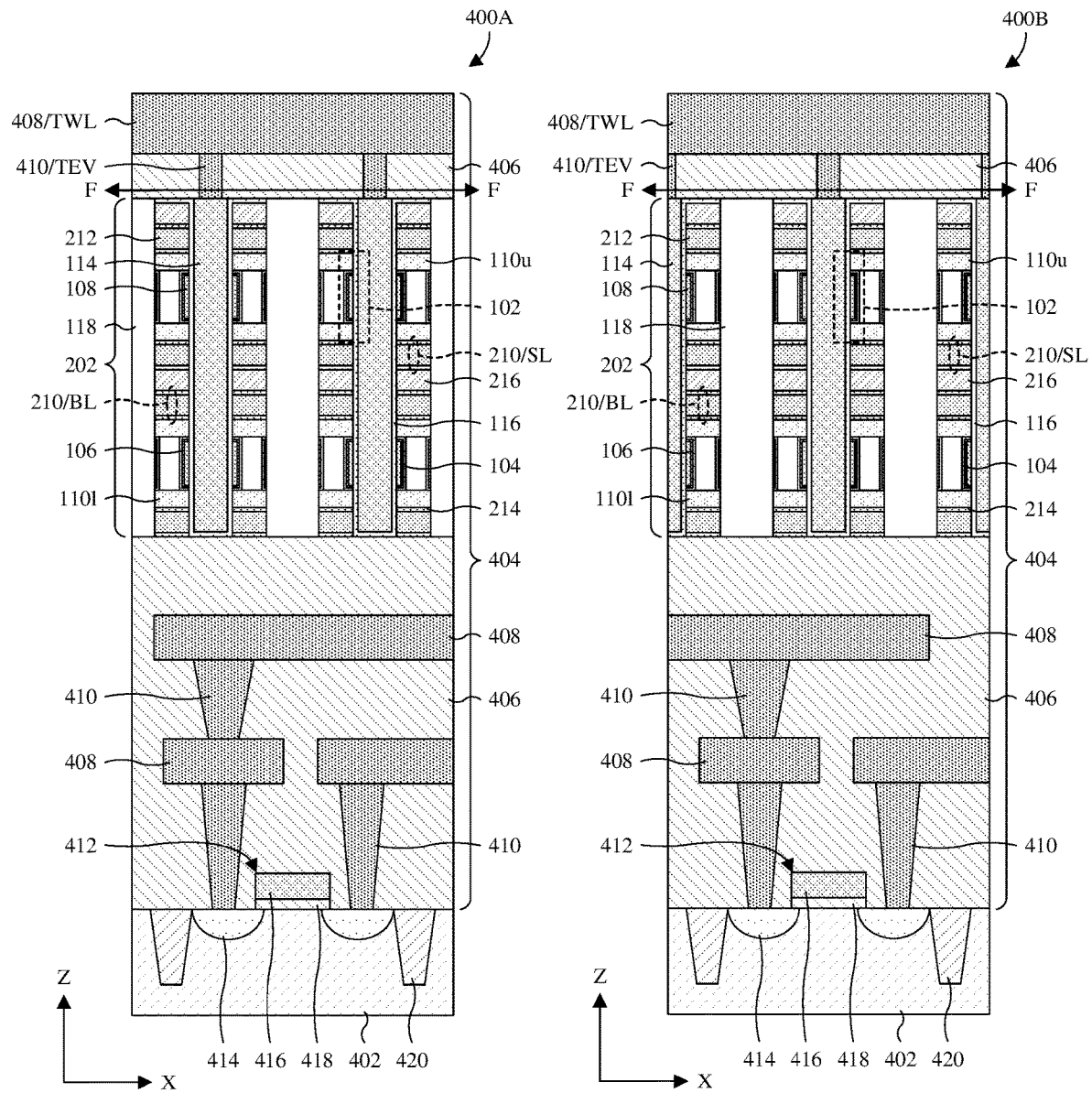
FIGS. 4A-4C illustrate various views of some embodiments of an integrated circuit (IC) comprising the 3D memory array of FIGS. 2A-2C.
Figure 4C:
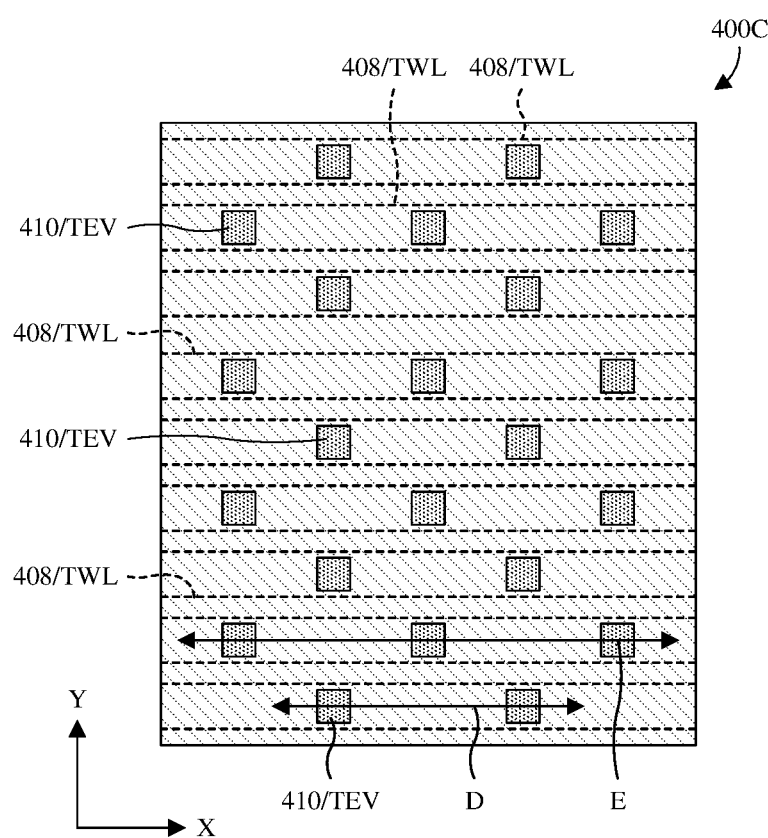

With reference to FIGS. 4A-4C, various views 400A-400C of some embodiments of an integrated circuit (IC) comprising the 3D memory array 202 of FIGS. 2A-2C is provided. FIG. 4A corresponds to a cross-sectional view 400A along line D in FIG. 4C, and FIG. 4B corresponds to a cross-sectional view 400B along line E in FIG. 4C. Further, FIG. 4C corresponds to a top view 400C along line F in FIGS. 4A and 4B.

The 3D memory array 202 overlies a semiconductor substrate 402 within an interconnect structure 404. The semiconductor substrate 402 may, for example, be or comprise a bulk substrate of monocrystalline silicon and/or some other suitable type of semiconductor substrate. The interconnect structure 404 comprises an interconnect dielectric layer 406, a plurality of wires 408, and a plurality of vias 410. The wires 408 and the vias 410 are alternatingly stacked in the interconnect dielectric layer 406 to define conductive paths over and under the 3D memory array 202. The interconnect dielectric layer 406 may, for example, be or comprise silicon oxide and/or some other suitable dielectric(s). The wires 408 and the vias 410 may, for example, be or comprise metal and/or some other suitable conductive material(s).

The plurality of wires 408 define a plurality of top word line wires TWL overlying the 3D memory array 202 and extending correspondingly along the rows of the 3D memory array 202. Further, the plurality of vias 410 define top electrode vias TEV extending respectively from the control gate electrodes 114 respectively to the top word lines TWL. Hence, top word lines TWL and the top electrode vias TEV electrically couple to and interconnect control gate electrodes in corresponding rows.

Semiconductor devices 412 are on the semiconductor substrate 402, between the semiconductor substrate 402 and the interconnect structure 404. The semiconductor devices 412 comprise corresponding pairs of source/drain regions 414, corresponding gate electrodes 416, and corresponding gate dielectric layers 418. The gate electrodes 416 correspond to the pairs of source/drain regions 414 and are laterally sandwiched between the source/drain regions of the corresponding pairs. The gate dielectric layer 418 respectively underlie the gate electrodes 416 to separate the gate electrodes 416 from the semiconductor substrate 402. The semiconductor devices 412 may, for example, be metal-oxide-semiconductor (MOS) FETs or some other suitable semiconductor devices. Further, the semiconductor devices 412 may, for example, implement read and write circuitry for the 3D memory array 202.

A trench isolation structure 420 extends into the semiconductor substrate 402 to provide electrical isolation between the semiconductor devices 412 and other semiconductor devices (not shown) on the semiconductor substrate 402. The trench isolation structure 420 may, for example, be or comprise silicon oxide and/or some other suitable dielectric(s). Further, the trench isolation structure 420 may, for example, be or comprise a shallow trench isolation (STI) structure and/or some other suitable type of trench isolation structure.

While the 3D memory array 202 of FIGS. 4A-4C is configured according to FIGS. 2A-2C, the 3D memory array 202 may alternatively be configured according to any one of FIGS. 3A-3E or according to some other suitable 3D memory array.

Figure 5:
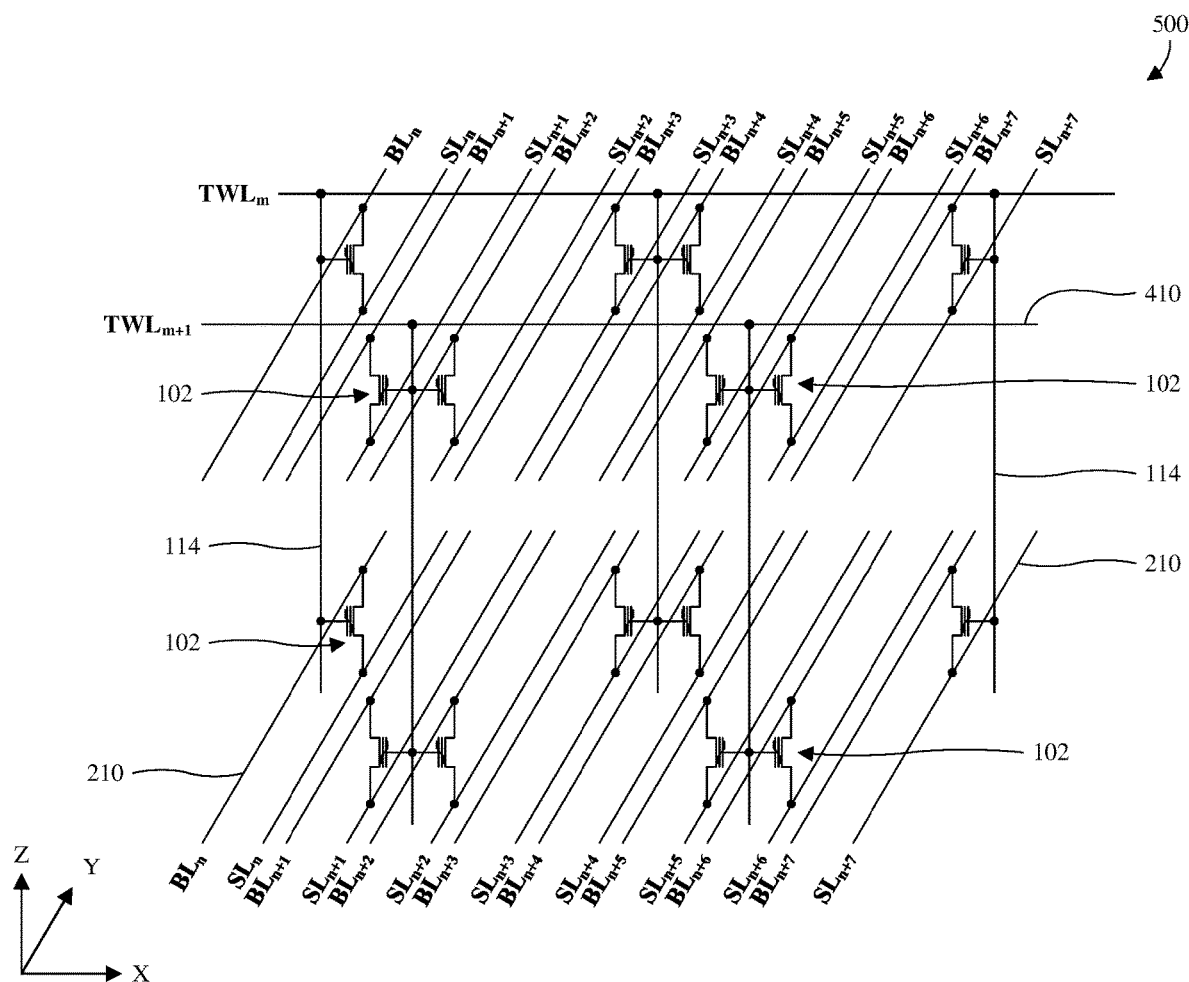
FIG. 5 illustrates a perspective view of some embodiments of a pair of neighboring rows in the 3D memory array of FIGS. 4A-4C.

With reference to FIG. 5, a perspective view 500 of some embodiments of a pair of neighboring rows in the 3D memory array 202 of FIGS. 4A-4C is provided. The rows have corresponding top word lines TWL with subscripts denoting specific row numbers beginning at row m, where m is an integer value. The columns have corresponding bit lines BL and corresponding source lines SL with subscripts denoting specific column numbers beginning at column n, where n is an integer value.

The top word lines TWL extend correspondingly along the rows and electrically couple to the MFMIS memory cells 102 in the corresponding rows via the control gate electrodes 114 in the corresponding rows. The bit lines BL and the source lines SL extend correspondingly along the columns and electrically couple to the MFMIS memory cells 102 in the corresponding columns via the lower and upper source/drain regions 110*l*, 110*u* (see, e.g., FIGS. 4A-4C) in the corresponding columns. Collectively, the top word lines TWL, the bit lines BL, and the source lines SL facilitate read and write operations on the MFMIS memory cells 102.

Figure 6A:
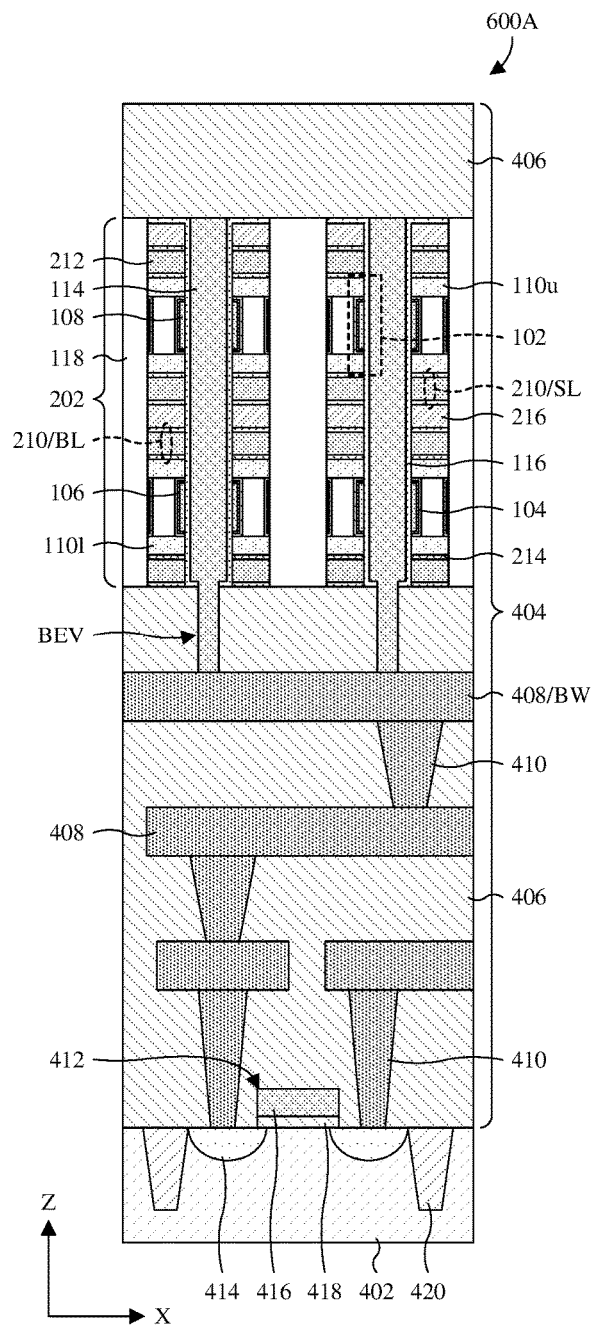
FIGS. 6A and 6B illustrate cross-sectional views of some alternative embodiments of the IC of FIGS. 4A-4C in which word lines are respectively at a bottom of the 3D memory array and a top of the 3D memory array.
Figure 6B:
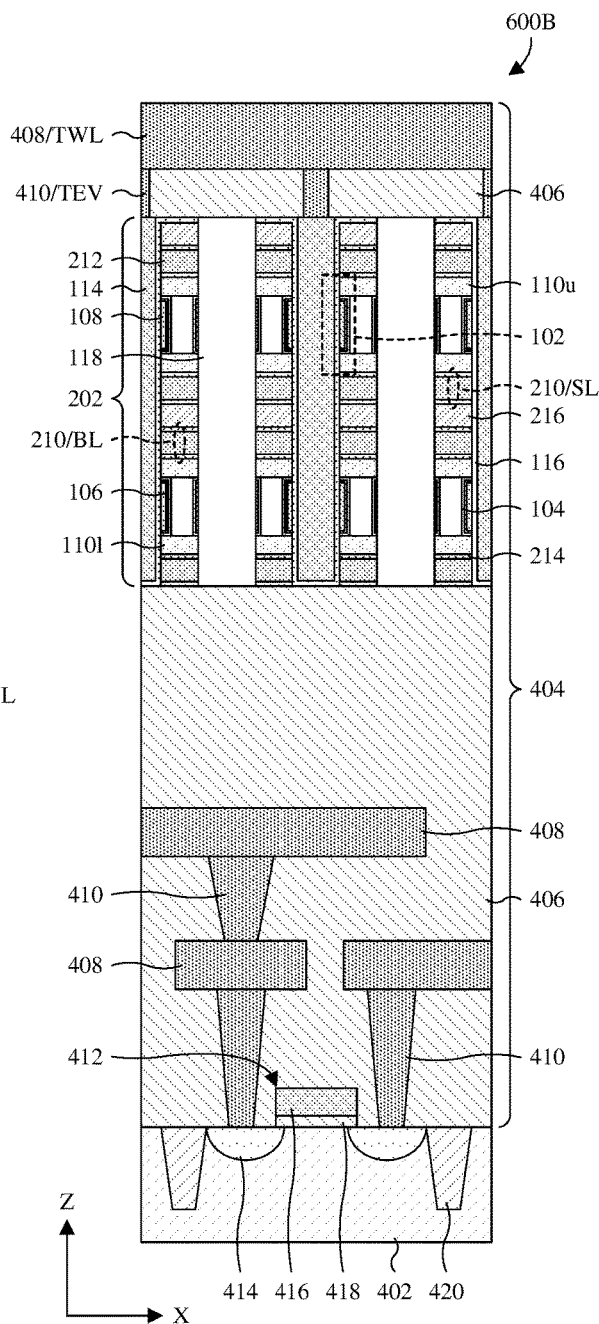

With reference to FIGS. 6A and 6B, cross-sectional views 600A, 600B of some alternative embodiments of the IC of FIGS. 4A-4C is provided in which word lines electrically couple to the control gate electrodes 114 respectively at a bottom of the 3D memory array 202 and a top of the 3D memory array 202. The cross-sectional view 600A of FIG. 6A corresponds to the cross-sectional view 400A of FIG. 4A, and the cross-sectional view 600B of FIG. 6B corresponds to the cross-sectional view 400B of FIG. 4B.

Control gate electrodes at even numbered rows electrically couple to bottom word lines BWL at a bottom of the 3D memory array 202, and control gate electrodes at odd numbered rows electrically couple to top word lines TWL at a top of the 3D memory array 202, or vice versa.

Further, the control gate electrodes 114 have different cross-sectional profiles depending upon whether electrically coupled to top or bottom word lines. Control gate electrodes electrically coupled to the bottom word lines BWL have protrusions that protrude respectively to the bottom word lines BWL and that define bottom electrode vias BEV. Control gate electrodes electrically coupled the top word lines TWL lack upward and downward protrusions and are electrically coupled to the top word lines TWL by top electrode vias TEV.

By splitting the word lines between the bottom of the 3D memory array 202 and the top of the 3D memory array 202, a pitch of the word lines in a Y direction (e.g., into and out of the page; see, for example, FIG. 4C) may be reduced. Design constraints regarding the spacing of the word lines may otherwise limit the pitch. By reducing the pitch of the word lines, scaling down of the 3D memory array 202 may be enhanced.

Figures 7A, 7B:
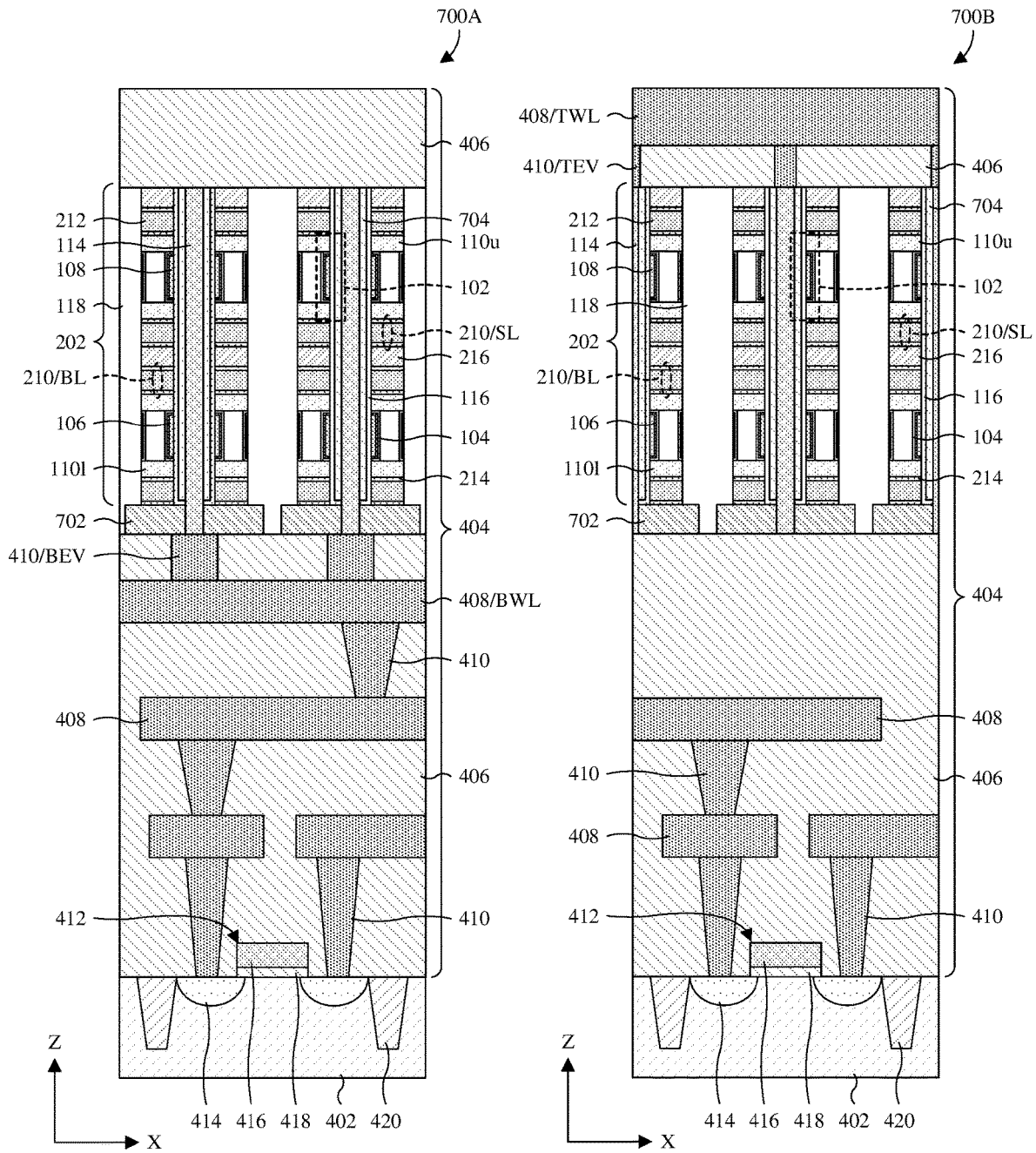
FIGS. 7A and 7B illustrate cross-sectional views of some alternative embodiments of the IC of FIGS. 6A-6C.

With reference to FIGS. 7A and 7B, a cross-sectional view 700A, 700B of some alternative embodiments of the IC of FIGS. 6A and 6B is provided in which the bottom electrode vias BEV are independent of the control gate electrodes 114. The control gate electrodes 114 have the same or substantially the same profile regardless of whether electrically coupled to top or bottom word lines. Further, the control gate electrodes 114 extend through a cap dielectric layer 702 between the 3D memory array 202 and the bottom electrode vias BEV. Control gate electrodes electrically coupled to the bottom word lines BWL extend through the cap dielectric layer 702 respectively to the bottom electrode vias BEV. Control gate electrodes electrically coupled to the top word lines TWL extend through the cap dielectric layer 702 to the interconnect dielectric layer 406. The cap dielectric layer 702 may be or comprise, for example, silicon nitride and/or some other suitable dielectric(s).

A plurality of spacers 704 separate the control gate electrodes 114 from the ferroelectric layers 116, and the dielectric structure 118 protrudes through the cap dielectric layer 702 to the interconnect dielectric layer 406. The spacers 704 may be or comprise, for example, silicon nitride and/or some other suitable dielectric(s).

As seen hereafter, the spacers 704 may be formed by a self-aligned process and used with a top one of the array dielectric layers 216 as a mask to form openings within which the control gate electrodes 114 are formed. This may lead to a reduction in the number of photomasks used while forming the 3D memory array 202. Because photolithography is expensive, the reduction may lead to a substantial cost savings. Further, as seen hereafter, the spacers 704 protect the ferroelectric layer 116 while forming openings within which the control gate electrodes 114 are formed. This, in turn, reduces the likelihood of damage to the ferroelectric layer 116 and may hence enhance performance of the MFMIS memory cells 102. Further yet, by forming the bottom electrode vias BEV independent of the control gate electrodes 114, aspect ratios (e.g., ratios of height to width) of the openings within which the control gate electrodes 114 are formed may be reduced. This, in turn, may reduce the complexity of the etch used to form the openings and may enlarge the process window (e.g., the resiliency).

While the embodiments of the ICs in FIGS. 6A, 6B, 7A, and 7B were not accompanied with top views, it is to be appreciated that the top view 400C of FIG. 4C is representative of these top views with a few modifications. Top electrode vias TEV and top word lines TWL at even numbered rows or odd numbered rows, but not both, instead correspond to bottom electrode vias BEV and bottom word lines BWL and should therefore be shown in phantom. Further, sizes of electrode vias and/or shapes of electrode vias may be different. Accordingly, the cross-sectional views 600A, 700A of FIGS. 6A and 7A may, for example, be taken along line D in FIG. 4C (as modified above), and the cross-sectional views 600B, 700B of FIGS. 6B and 7B may, for example, be taken along line E in FIG. 4C (as modified above).

With reference to FIGS. 8A and 8B through FIGS. 15A and 15B, FIGS. 16A-16C, and FIGS. 17A and 17B, a series of views of some embodiments of a method for forming an IC comprising a 3D memory array of MFMIS memory cells is provided. Figures labeled with a suffix of B illustrate cross-sectional views along line A" in like-numbered figures with a suffix of A. Where present, figures labeled with a suffix of C illustrate cross-sectional views along line B" in like-numbered figures with a suffix of A. Figures with a suffix of A illustrate top views along line G, G', or G" (whichever is present) in like-numbered figures with a suffix of B and, where present, like-numbered figures with a suffix of C. The method is illustrated using embodiments of the IC at FIGS. 4A-4C but may form other suitable embodiments.

Figure 8A:
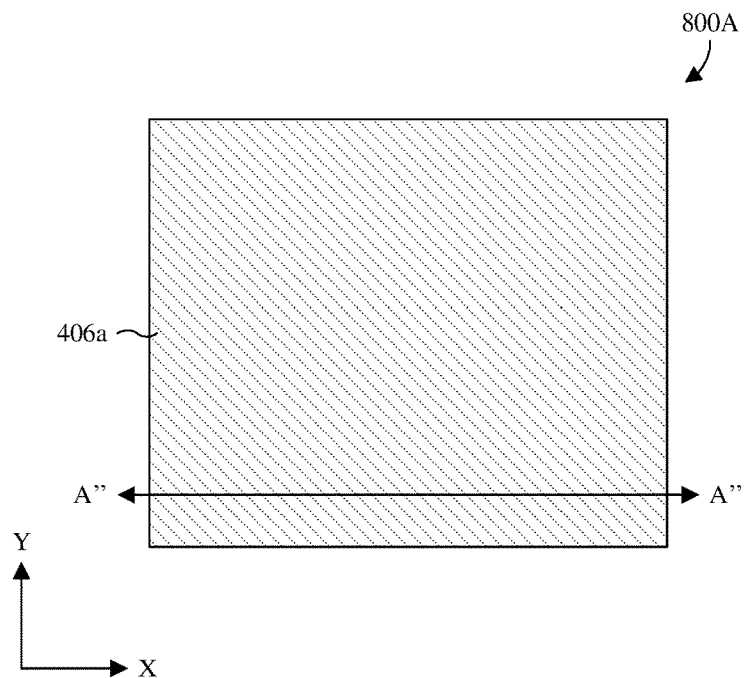
Figure 8B:
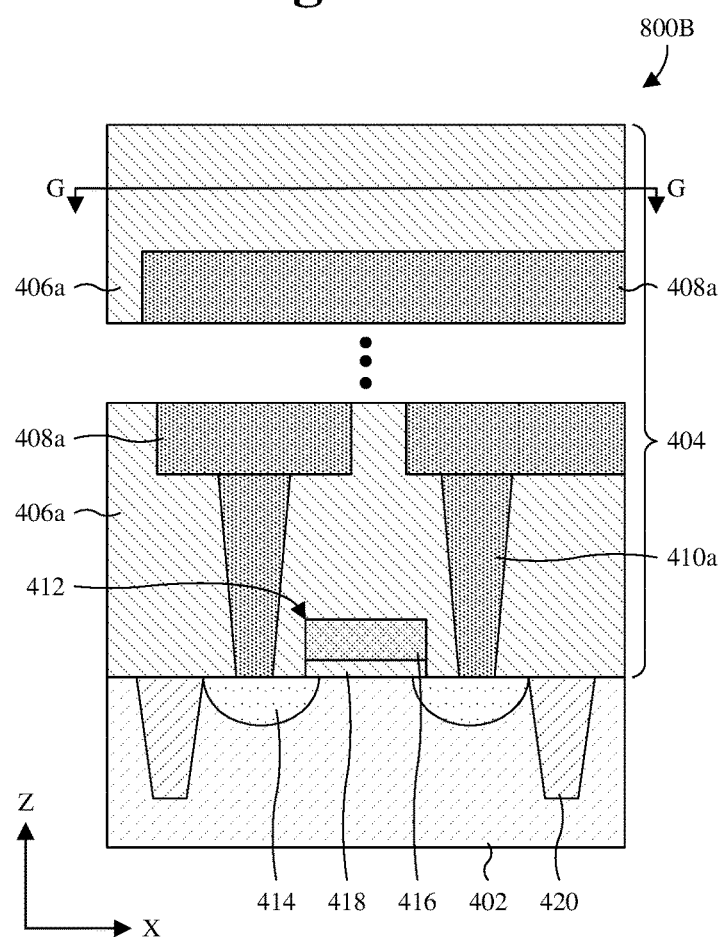

As illustrated by the top and cross-sectional views 800A, 800B of FIGS. 8A and 8B, a semiconductor device 412 and a trench isolation structure 420 are formed on a semiconductor substrate 402. The semiconductor device 412 comprises a pair of source/drain regions 414, a gate electrode 416, and a gate dielectric layer 418. The gate electrode 416 and the gate dielectric layer 418 are stacked between the source/drain regions 414. The trench isolation structure 420 surrounds the semiconductor device 412 to electrically isolate the semiconductor device 412 from other semiconductor devices (not shown).

Also illustrated by the top and cross-sectional views 800A, 800B of FIGS. 8A and 8B, an interconnect structure 404 is partially formed over the semiconductor device 412 and the semiconductor substrate 402. The interconnect structure 404 comprises a lower interconnect dielectric layer 406a, a plurality of lower wires 408a, and a plurality of lower vias 410a. The lower wires 408a and the lower vias 410a are alternatingly stacked in the lower interconnect dielectric layer 406a and define conductive paths leading from the semiconductor device 412 and other semiconductor devices (not shown) on the semiconductor substrate 402.

Figure 9A:
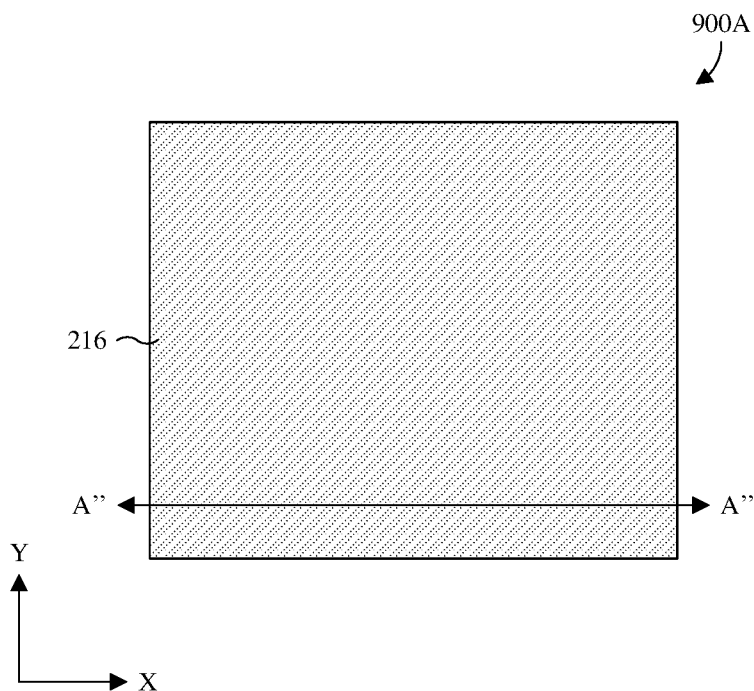
Figure 9B:
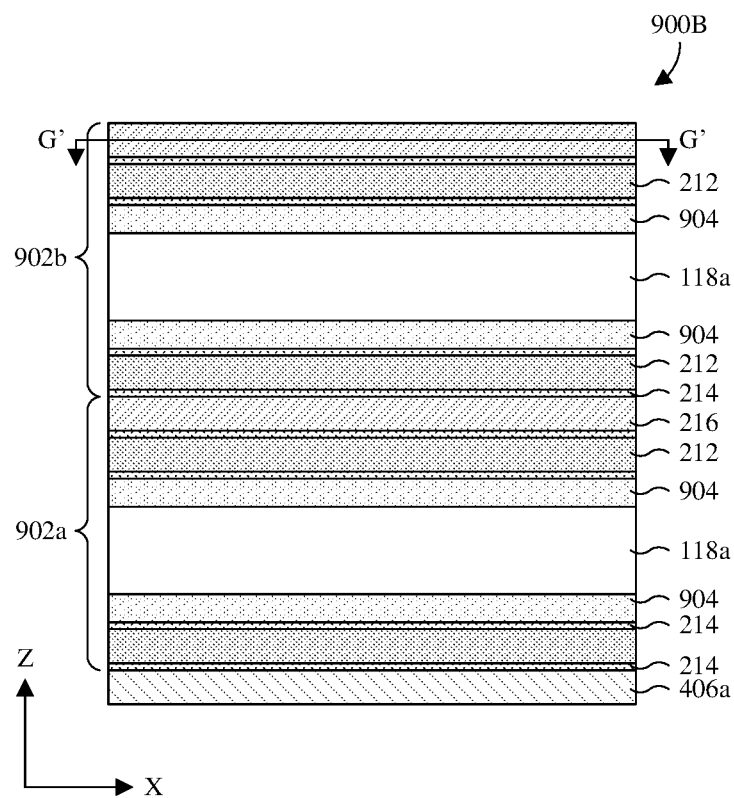

As illustrated by the top and cross-sectional views 900A, 900B of FIGS. 9A and 9B, a first memory film 902a and a second memory film 902b are deposited over the interconnect structure 404 (see, e.g., FIGS. 8A and 8B). For ease of illustration, only a top portion of the interconnect structure 404 corresponding to the lower interconnect dielectric layer 406a is shown. A remainder of the interconnect structure 404 is as shown in FIGS. 8A and 8B. The first and second memory films 902a, 902b comprise corresponding barrier layers 214, corresponding metal layers 212, corresponding source/drain layers 904, corresponding source/drain dielectric layers 118a, and corresponding array dielectric layers 216 that are vertically stacked.

The metal layers 212 are each sandwiched between two of the barrier layers 214, and the barrier layers 214 are configured to prevent outward diffusion of material from corresponding metal layers. The source/drain dielectric layers 118a are each sandwiched between two of the source/drain layers 904, and the two source/drain layers are each sandwiched between two of the metal layers 212. The array dielectric layers 216 are a different material than a material of the lower interconnect dielectric layer 406a at a top surface of the lower interconnect dielectric layer 406a. Further, the array dielectric layers 216 are respectively at a top of the first and second memory films 902a, 902b.

In some embodiments, the source/drain layers 904 are or comprise doped polysilicon and/or some other suitable semiconductor material(s). In some embodiments, the source/drain dielectric layers 118a are or comprise silicon oxide and/or some other suitable dielectric(s). In some embodiments, the metal layers 212 are or comprise tungsten and/or some other suitable metal(s). In some embodiments, the barrier layers 214 are or comprise titanium nitride, tungsten nitride, some other suitable barrier material(s) for the metal layers 212, or any combination of the foregoing. In some embodiments, the array dielectric layers 216 are or comprise silicon nitride and/or some other suitable dielectric(s).

While two memory films are deposited stacked over the interconnect structure 404, more or less memory films may be deposited in alternative embodiments. For example, the second memory film 902b may be omitted, such that only a single memory film may be deposited. As another example, the second memory film 902b may be repeatedly deposited, such that three or more memory films may be deposited. In alternative embodiments, to form a 3D memory array according to FIG. 3A, the barrier layers 214 and the metal layers 212 may be omitted. In alternative embodiments, to form a 3D memory array according to FIG. 3C, silicide layers may be deposited in place of the barrier layers 214 and the metal layers 212. In alternative embodiments, to form a 3D memory array according to FIG. 3D, silicide layers may be deposited in place of the barrier layers 214, the metal layers 212, and the source/drain layers 904.

Figure 10A:
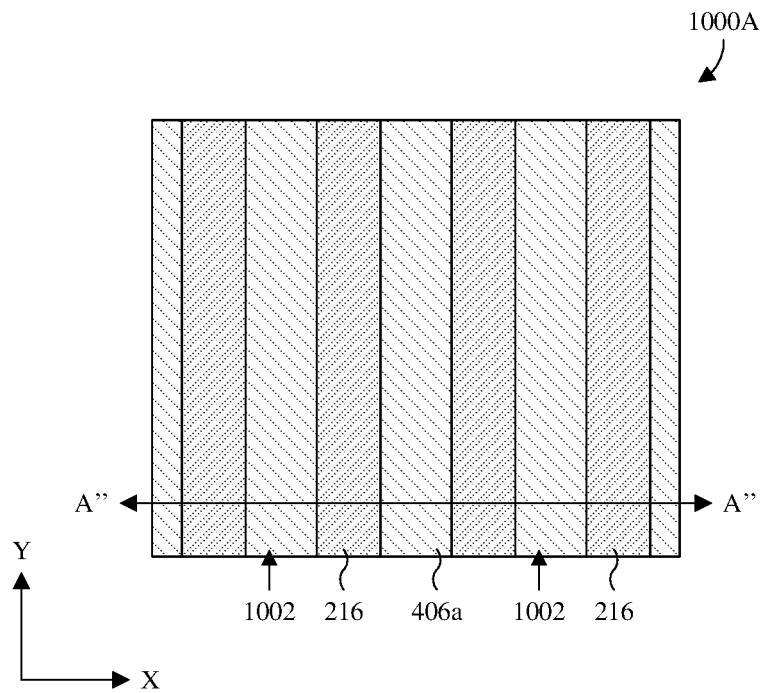
Figure 10B:
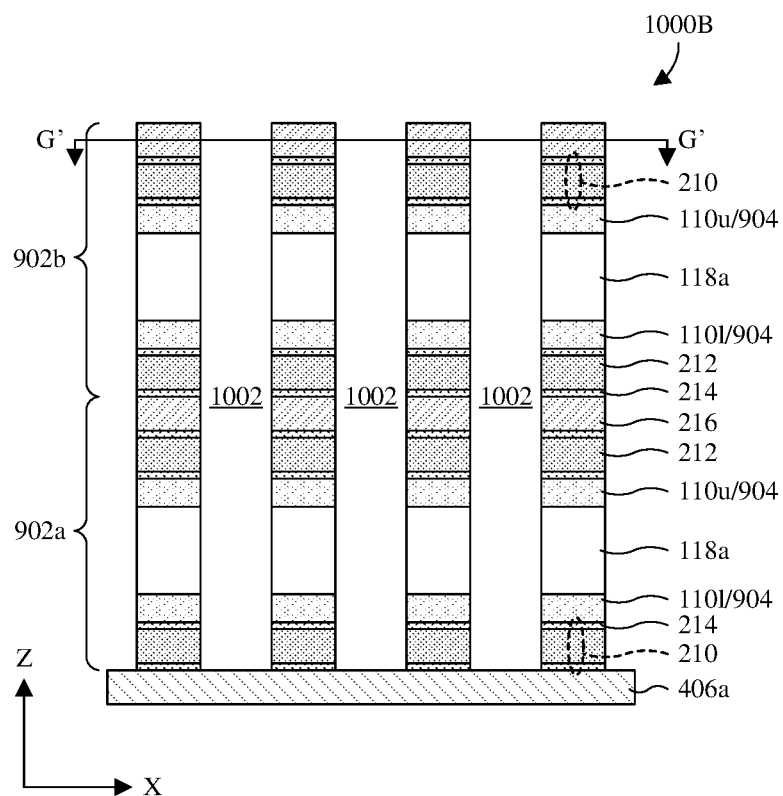

As illustrated by the top and cross-sectional views 1000A, 1000B of FIGS. 10A and 10B, the first and second memory films 902a, 902b are patterned to form a plurality of trenches 1002. The trenches 1002 are laterally elongated in parallel in a direction (e.g., a Y direction) transverse to the cross-sectional view 1000A of FIG. 10A. In some embodiments, the direction is the direction that columns of the 3D memory array being formed extend and/or the trenches 1002 have the same or substantially the same dimensions as each other. Further, the patterning divides the source/drain layers 904 into lower source/drain regions 110l and upper source/drain regions 110u and divides the metal and barrier layers 212, 214 into metal lines 210. The lower source/drain regions 110l are at lower sides of corresponding source/drain dielectric layers, and the upper source/drain regions 110u are at upper sides of corresponding source/drain dielectric layers. The patterning may, for example, be performed by a photolithography/etching process and/or some other suitable patterning process. The photolithography/etching process may, for example, use dry etching and/or some other suitable type of etching.

Figure 11A:
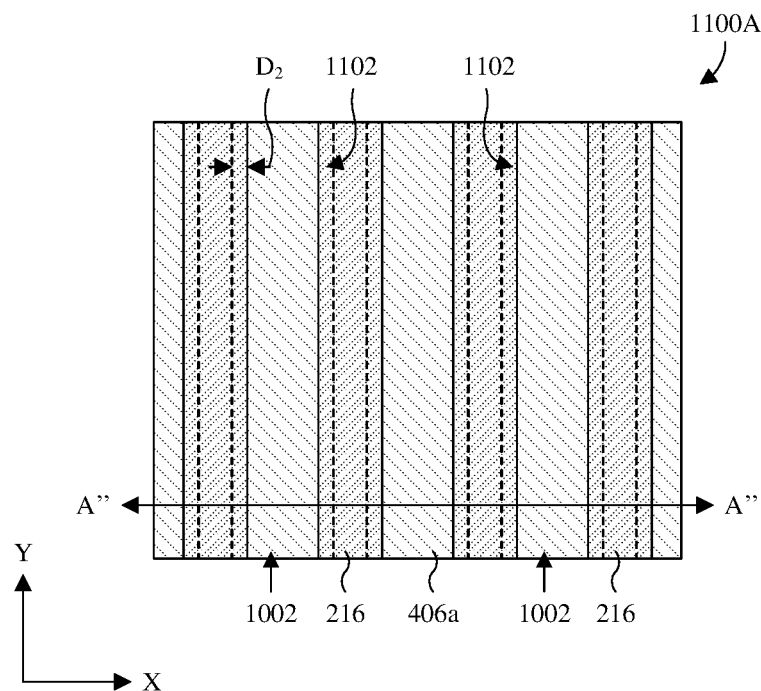
Figure 11B:
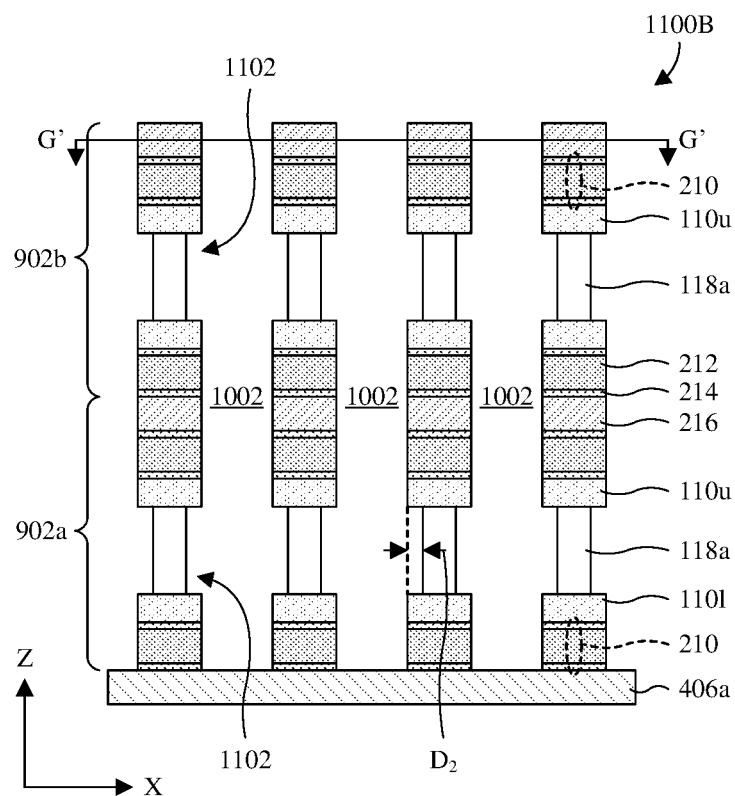

As illustrated by the top and cross-sectional views 1100A, 1100B of FIGS. 11A and 11B, the source/drain dielectric layers 118a are laterally recessed through the trenches 1002. The recessing recesses sidewalls of the source/drain dielectric layers 118a, relative to neighboring sidewalls of the lower and upper source/drain regions 110l, 110u, to form recesses 1102 with a lateral depth D2. Note that the recesses 1102 are shown in phantom in FIG. 11A. In some embodiments, the lateral depth D2 is about 10-30 nanometers, about 10-20 nanometers, about 20-30 nanometers, or some other suitable depth. The lateral recessing may, for example, be performed by wet etching and/or some other suitable type of etching.

In alternative embodiments, to form a 3D memory array according to FIG. 3B, the metal lines 210 are additionally recessed laterally through the trenches 1002. This additional recessing recesses sidewalls of the metal lines 210, relative to neighboring sidewalls of the lower and upper source/drain regions 110*l*, 110*u*, to form additional recesses. The additional recesses are then filled in the same manner described hereafter for the recesses 1102.

Figure 12A:
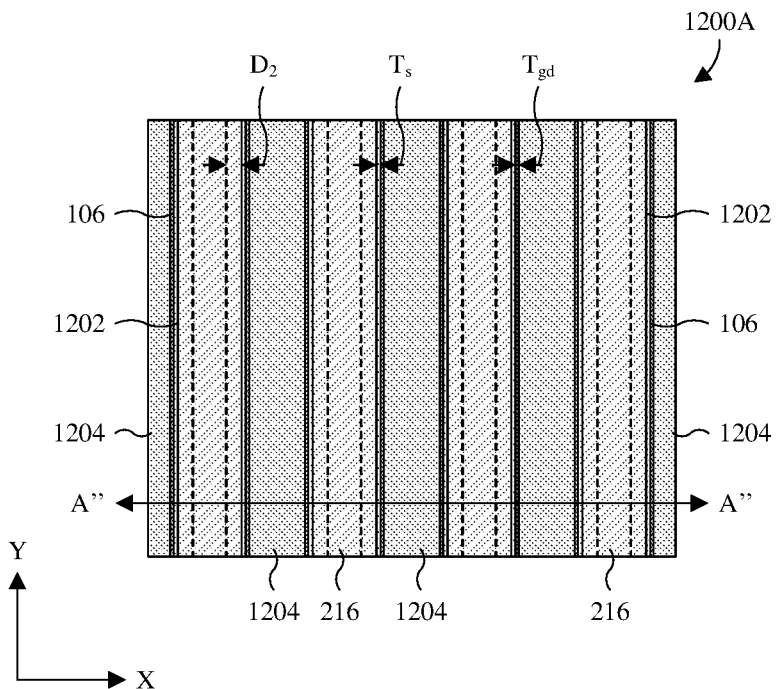
Figure 12B:
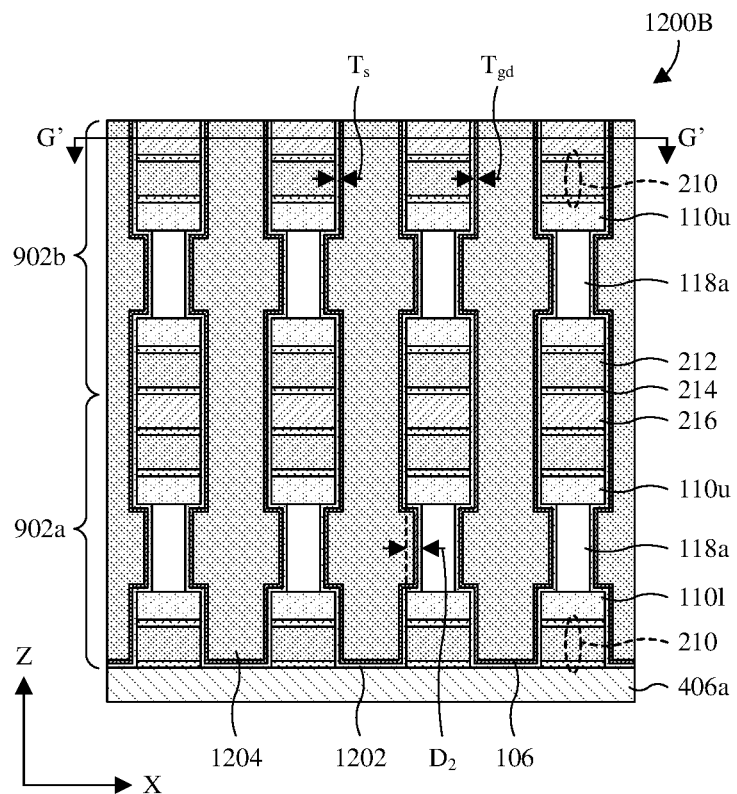

As illustrated by the top and cross-sectional views 1200A, 1200B of FIGS. 12A and 12B, a semiconductor layer 1202, a gate dielectric layer 106, and an internal electrode layer 1204 (collectively the recess layers) are formed filling the trenches 1002 (see, e.g., FIGS. 11A and 11B) and the recesses 1102 (see, e.g., FIGS. 11A and 11B). The semiconductor layer 1202 and the gate dielectric layer 106 are formed lining and partially filling the trenches 1002 and the recesses 1102. Further, the semiconductor layer 1202 separates the gate dielectric layer 106 from the first and second memory films 902*a*, 902*b*. The internal electrode layer 1204 is formed filling a remainder of the trenches 1002 and the recesses 1102 over the gate dielectric layer 106.

In some embodiments, a thickness $T_s$ of the semiconductor layer 1202 is about 5-7 nanometers and/or some other suitable value(s). Further, in some embodiments, the semiconductor layer 1202 is doped or undoped and/or is or comprises polysilicon and/or some other suitable semiconductor material(s). In some embodiments, a thickness $T_{gd}$ of the gate dielectric layer 106 is about 1-5 nanometers and/or some other suitable value(s). Further, in some embodiments, the gate dielectric layer 106 is or comprises silicon oxide, silicon nitride, silicon oxynitride, aluminum oxide, hafnium oxide, lanthanum oxide, zirconium oxide, some other suitable dielectric(s), or any combination of the foregoing. In some embodiments, the internal electrode layer 1204 is or comprises titanium nitride, doped polysilicon, tantalum nitride, tungsten, some other suitable conductive material(s), or any combination of the foregoing.

A process for forming the recess layers may, for example, comprise: 1) depositing the semiconductor layer 1202; 2) depositing the gate dielectric layer 106; 3) depositing the internal electrode layer 1204; and 4) performing a planarization into the recess layers until the array dielectric layer 216 of the second memory film 902*b* is reached. Alternatively, other suitable processes may form the recess layers. The planarization may, for example, be performed by a chemical mechanical polish (CMP) or some other suitable planarization.

Figure 13A:
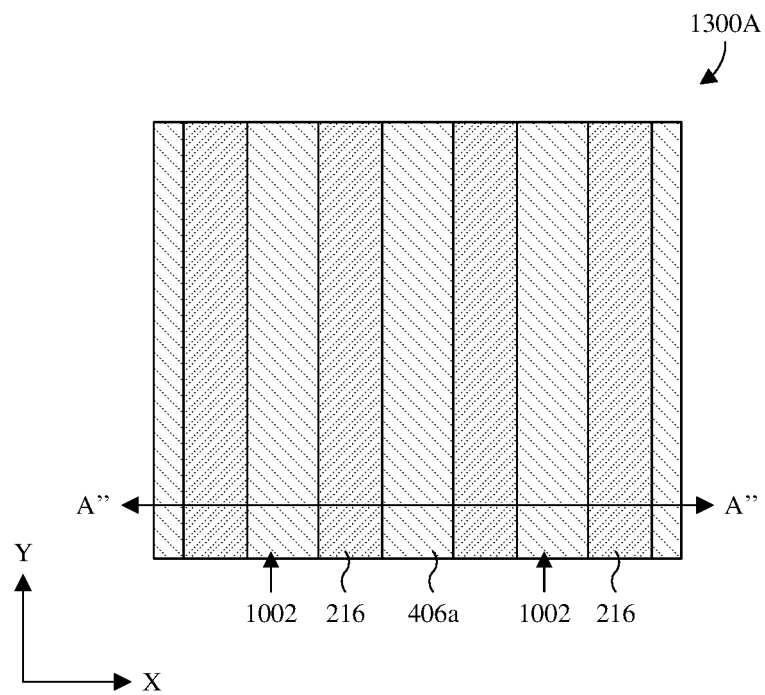
Figure 13B:
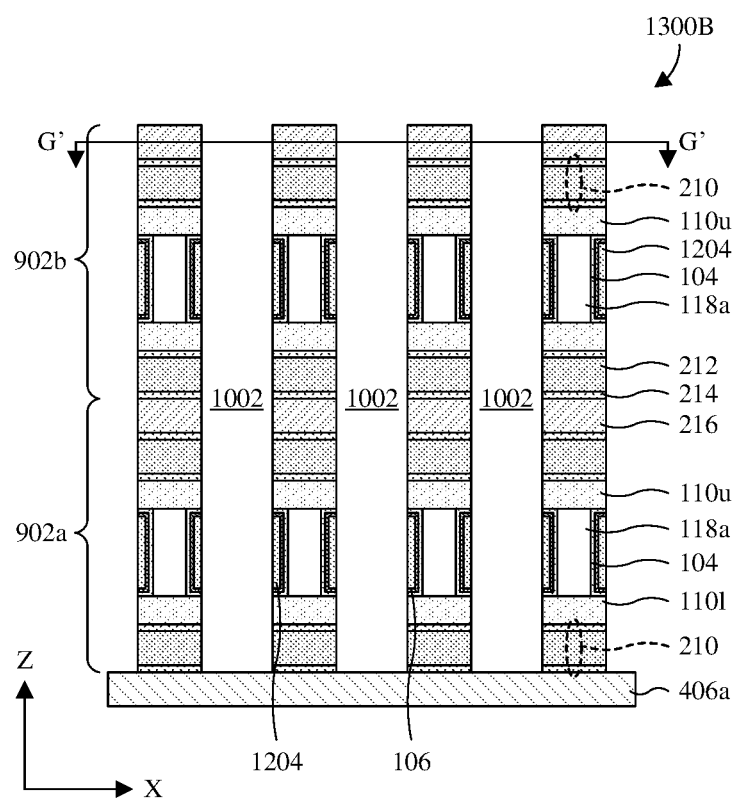

As illustrated by the top and cross-sectional views 1300A, 1300B of FIGS. 13A and 13B, the trenches 1002 are cleared. However, the recesses 1102 (see, e.g., FIGS. 11A and 11B) are not cleared or are minimally cleared. By doing so, a plurality of semiconductor channels 104 are formed localized to the recesses 1102 from the semiconductor layer 1202 (see, e.g., FIGS. 12A and 12B). Further, the internal electrode layer 1204 and the gate dielectric layer 106 are respectively divided into a plurality of internal electrode segments and a plurality of gate dielectric segments that are localized to the recesses 1102. The clearing may, for example, be performed by dry etching and/or some other suitable type of etching. Alternatively, other suitable processes for clearing the trenches 1002 may, for example, be performed. In some embodiments, the array dielectric layer 216 of the second memory film 902*b* is used as a mask during the etching.

Figure 14A:
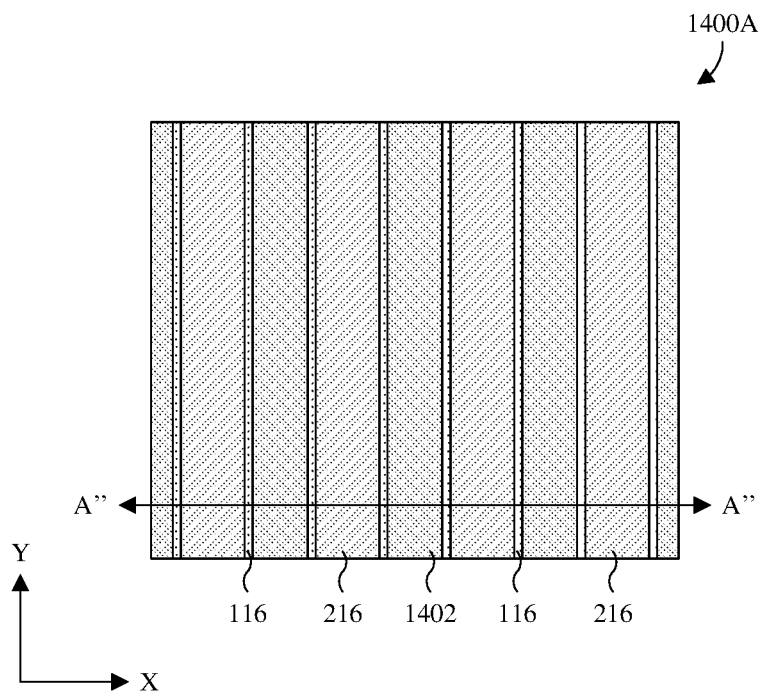
Figure 14B:
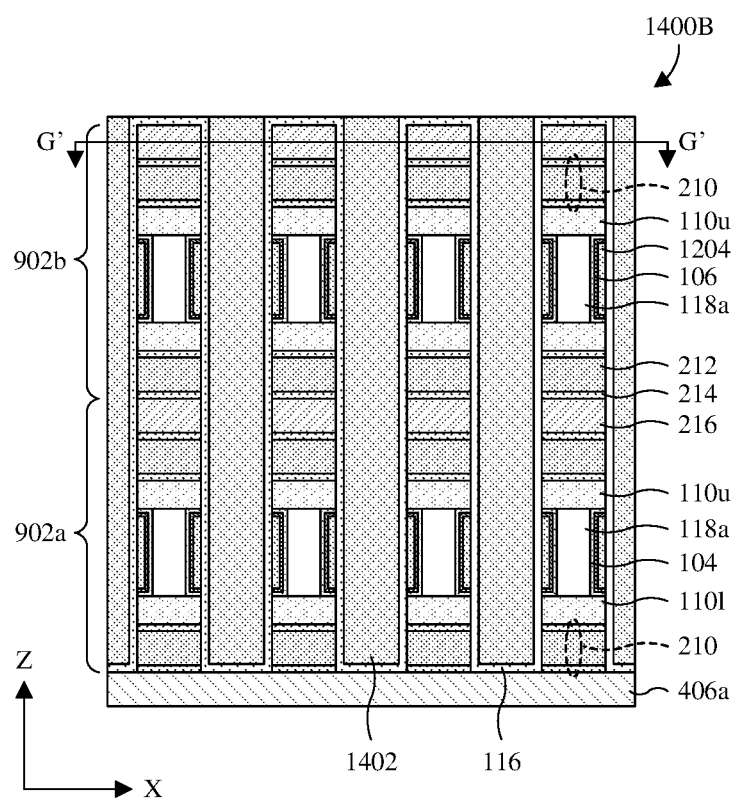

As illustrated by the top and cross-sectional views 1400A, 1400B of FIGS. 14A and 14B, a ferroelectric layer 116 and a control electrode layer 1402 (collectively the trench layers) are formed filling the trenches 1002. The ferroelectric layer 116 is formed lining and partially filling the trenches 1002, and the control electrode layer 1402 is formed filling a remainder of the trenches 1002 over the ferroelectric layer 116. In some embodiments, the control electrode layer 1402 is or comprises titanium nitride, doped polysilicon, tantalum nitride, tungsten, some other suitable conductive material(s), or any combination of the foregoing. In some embodiments, the ferroelectric layer 116 is or comprises doped hafnium oxide (e.g., doped with aluminum, silicon, zirconium, lanthanum, strontium, or the like) and/or some other suitable ferroelectric material(s).

A process for forming the trench layers may, for example, comprise: 1) depositing the ferroelectric layer 116; 2) depositing the control electrode layer 1402 over the ferroelectric layer 116; and 3) performing a planarization into the control electrode layer 1402 until the ferroelectric layer 116 is reached. Alternatively, other suitable processes may form the trench layers. The planarization may, for example, be performed by a CMP or some other suitable planarization.

Figure 15A:
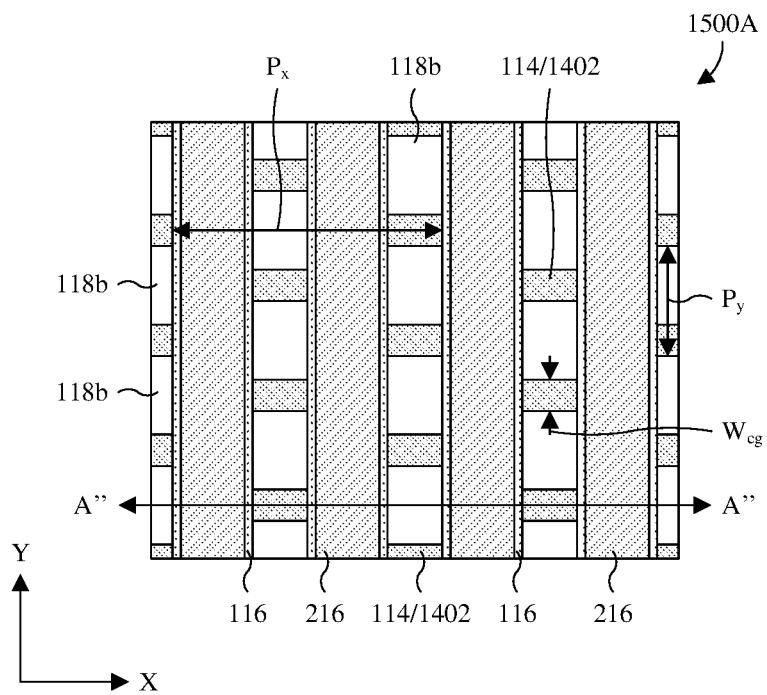
Figure 15B:
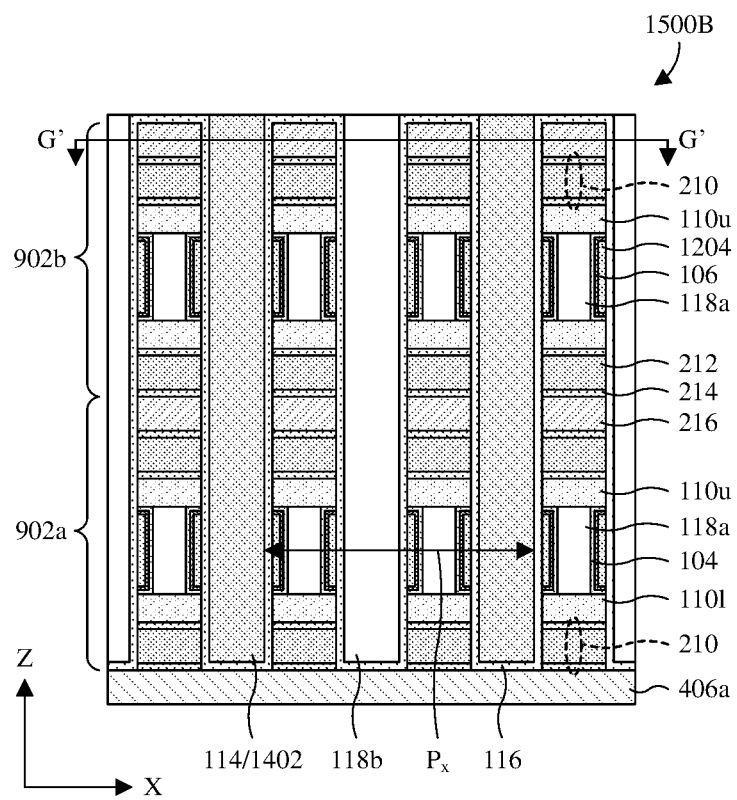

As illustrated by the top and cross-sectional views 1500A, 1500B of FIGS. 15A and 15B, a first inter-gate dielectric layer 118*b* is formed extending through the control electrode layer 1402 and dividing the control electrode layer 1402 into a plurality of control gate electrodes 114. The first inter-gate dielectric layer 118*b* may, for example, be or comprise silicon oxide and/or some other suitable dielectric(s). The control gate electrodes 114 are arranged in a plurality of rows and a plurality of columns, such that a control gate electrode occurs every other column along each row and such that a control gate electrode occurs every other row along each column. Further, the control gate electrodes 114 are staggered along neighboring columns and neighboring rows, such that a pitch $P_y$ of the control gate electrodes 114 in the Y direction spans a row and a pitch $P_x$ of the control gate electrodes 114 in the X direction spans a column. In some embodiments, the control gate electrodes 114 have individual widths $W_{cg}$ that are less than about half the Y-direction pitch $P_y$.

A process for forming the first inter-gate dielectric layer 118*b* may, for example, comprise: 1) patterning the control electrode layer 1402 to form openings dividing the control electrode layer 1402 into the control gate electrodes 114; 2) depositing a dielectric layer filling the openings; and 3) performing a planarization into the dielectric layer until the ferroelectric layer 116 is exposed. In alternative embodiments, the first inter-gate dielectric layer 118*b* is formed by some other suitable process. The patterning may, for example, be performed by a photolithography/etching process and/or some other suitable patterning process. The photolithography/etching process may, for example, use the ferroelectric layer 116 as an etch stop and/or may, for example, use dry etching and/or some other suitable type of etching.

Figure 16A:
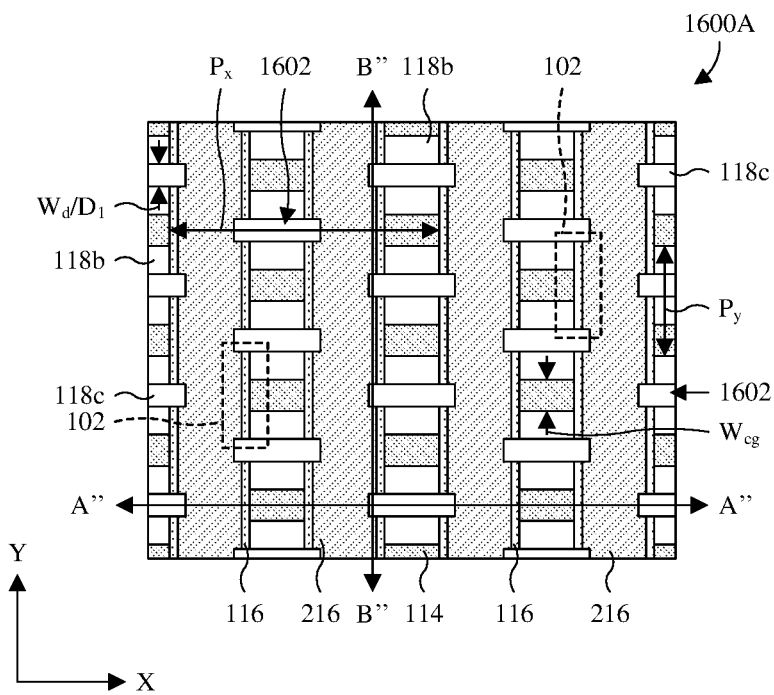
Figure 16B:
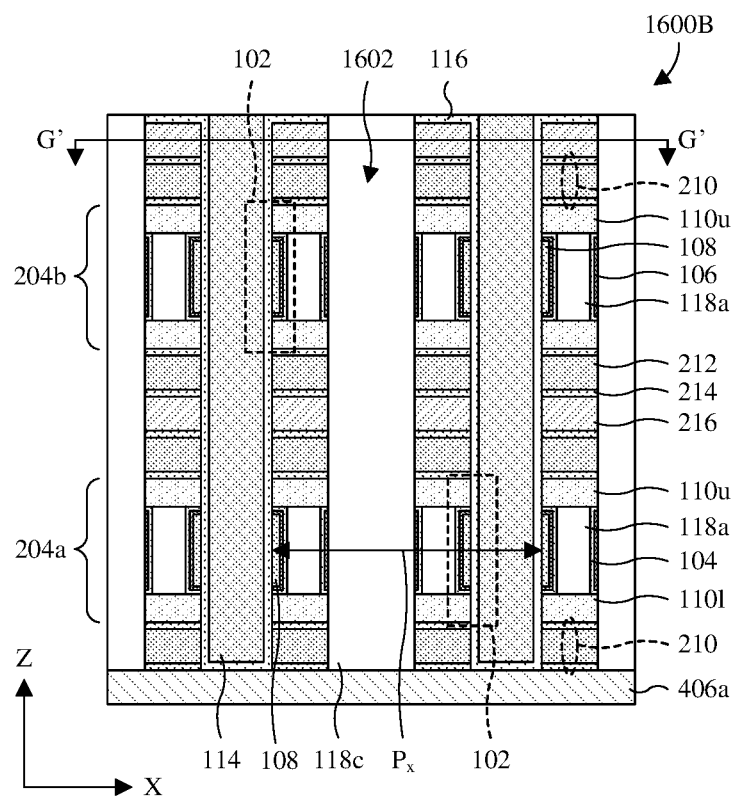
Figure 16C:
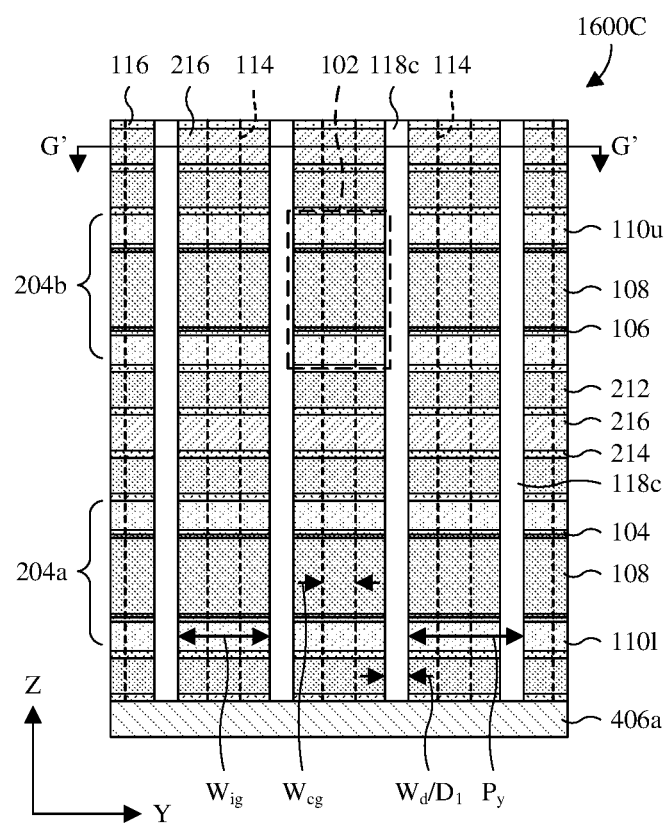

As illustrated by the top and cross-sectional views 1600A-1600C of FIGS. 16A-16C, a second inter-gate dielectric layer 118*c* is formed extending through the internal electrode layer 1204, the ferroelectric layer 116, and the first inter-gate dielectric layer 118*b*. The second inter-gate dielectric layer 118*c* has a plurality of dielectric segments 1602 dividing the internal electrode layer 1204 into a plurality of internal gate electrodes 108. The dielectric segments 1602 are arranged so as to alternate with the control gate electrodes 114 along each row and along each column. In some embodiments, the dielectric segments 1602 have individual widths $W_d$ that are less than about half the Y-direction pitch $P_y$ and/or separate internal gate electrodes neighboring in a column by a distance Di less than about half the Y-direction pitch $P_y$. The second inter-gate dielectric layer 118*c* and hence the dielectric segments 1602 may, for example, be or comprise silicon oxide and/or some other suitable dielectric(s).

A process for forming the second inter-gate dielectric layer 118c may, for example, comprise: 1) patterning the internal electrode layer 1204, the ferroelectric layer 116, and the first inter-gate dielectric layer 118b to form openings dividing the internal electrode layer 1204 into the internal gate electrodes 108; 2) depositing a dielectric layer filling the openings; and 3) performing a planarization into the dielectric layer until the ferroelectric layer 116 is exposed. In alternative embodiments, the second inter-gate dielectric layer 118c is formed by some other suitable process. The patterning may, for example, be performed by a photolithography/etching process and/or some other suitable patterning process. The photolithography/etching process may, for example, use the lower interconnect dielectric layer 406a as an etch stop and/or may, for example, use dry etching and/or some other suitable type of etching.

Forming the second inter-gate dielectric layer 118c and dividing the internal electrode layer 1204 into the plurality of internal gate electrodes 108 completes a first memory array 204a and a second memory array 204b. The first and second memory arrays 204a, 204b are vertically stacked over the lower interconnect dielectric layer 406a and are made up of plurality of MFMIS memory cells 102. Each of the MFMIS memory cells 102 has an individual one of the internal gate electrodes 108 and further has a localized portion of the ferroelectric layer 116. The localized portion of the ferroelectric layer 116 has a polarity representing a bit of data.

During program and erase operations for any one of the MFMIS memory cells 102, the MFMIS memory cell may be modeled as a MIS parallel-plate capacitor (MIS capacitor for short) and a ferroelectric parallel-plate capacitor (ferroelectric capacitor for short) that are electrically coupled in series. The internal gate electrode 108 of the MFMIS memory cell and the semiconductor channel 104 of the MFMIS memory cell define parallel plates of the MIS capacitor, and the gate dielectric layer 106 defines an insulator of the MIS capacitor. The internal and control gate electrodes 108, 114 of the MFMIS memory cell define parallel plates of the ferroelectric capacitor, and the ferroelectric layer 116 defines an insulator of the ferroelectric capacitor. In both the MIS capacitor and the ferroelectric capacitor, the parallel plates are parallel to the cross-sectional view 1600C of FIG. 16C.

A capacitor area of a parallel plate capacitor corresponds to the overlap between opposing surfaces respectively of the parallel plates when the opposing surfaces are projected onto a two-dimensional (2D) plane that is parallel to the opposing surfaces. Because of the internal gate electrodes 108, the ferroelectric capacitors of the MFMIS memory cells 102 may have different capacitor areas than the MIS capacitors of the MFMIS memory cells 102. If the internal gate electrodes 108 were omitted, the ferroelectric capacitors and the MIS capacitors would share the same parallel plates and would therefore share the same capacitor areas. Further, as seen above, the acts at FIGS. 15A, 15B, and 16A-16C allow the individual widths $W_{cg}$ of the control gate electrodes 114 and the individual widths $W_{ig}$ of the internal gate electrodes 108 to be independently defined. For example, the acts at FIGS. 15A and 15B may be employed to define the individual widths $W_{cg}$ of the control gate electrodes 114, whereas the acts at FIGS. 16A-16C may be employed to define the individual widths $W_{ig}$ of the internal gate electrodes 108. Accordingly, the capacitor areas of the ferroelectric and MIS capacitors may be independently tuned via the individual widths $W_{ig}$, $W_{cg}$ of the internal and control gate electrodes 108, 114.

Because the ferroelectric and MIS capacitors for any one of the MFMIS memory cells 102 are electrically coupled in series during program and erase operations, an electric field ratio for the ferroelectric and MIS capacitors is equal to the inverse of the dielectric constant ratio times the inverse of the capacitor area ratio. Accordingly, the electric field ratio may be tuned by the dielectric constant ratio and/or the capacitor area ratio. A dielectric constant is a material dependent parameter, such that material constraints may limit tuning of the electric field ratio based on dielectric constants. However, the individual widths $W_{ig}$, $W_{cg}$ of the internal and control gate electrodes 108, 114 and hence the capacitor areas may be tuned by the method for forming the MFMIS memory cells 102. Hence, the electric field ratio may be tuned based on capacitor areas during the method for forming the MFMIS memory cells 102.

Because the electric field ratio may be tuned, the ferroelectric layer 116 may have a high electric field during program and erase operations while the gate dielectric layer 106 may have a low electric field during program and erase operations. Because the ferroelectric layer 116 may have a high electric field, polarization of the ferroelectric layer 116 may strongly switch during program and erase operations. As a result, the difference between readout currents while the ferroelectric layer 116 is respectively at programmed and erased states may be large (e.g., the memory window may be large). Further, because the ferroelectric layer 116 may have a high electric field, program and erase voltages may be low and hence power consumption may be low. Because the gate dielectric layer 106 may have a low electric field, stress on the gate dielectric layer 106 may be low. This, in turn, may improve the reliability of the gate dielectric layer 106 and the TDDB of the gate dielectric layer 106. Accordingly, the endurance of the MFMIS memory cells 102 and the retention of the MFMIS memory cells 102 may be enhanced.

Figure 17A:
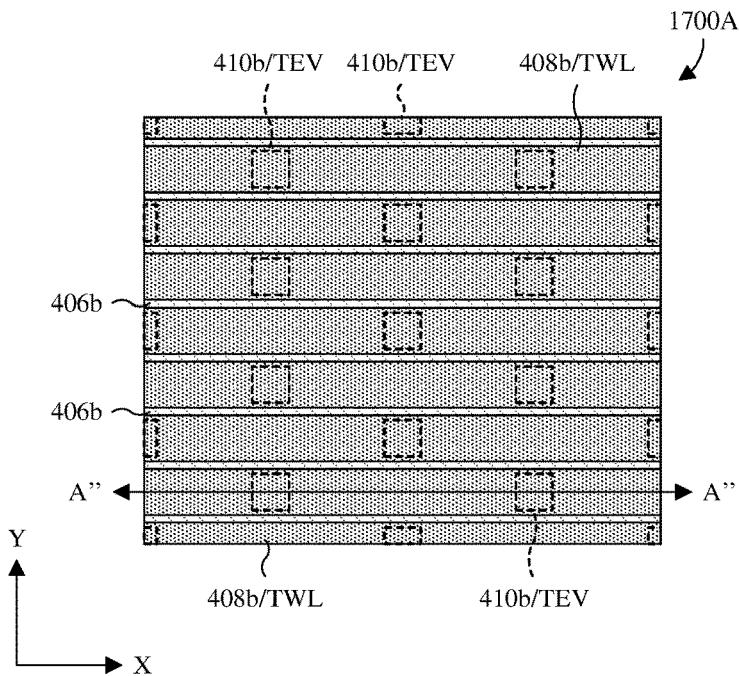
Figure 17B:
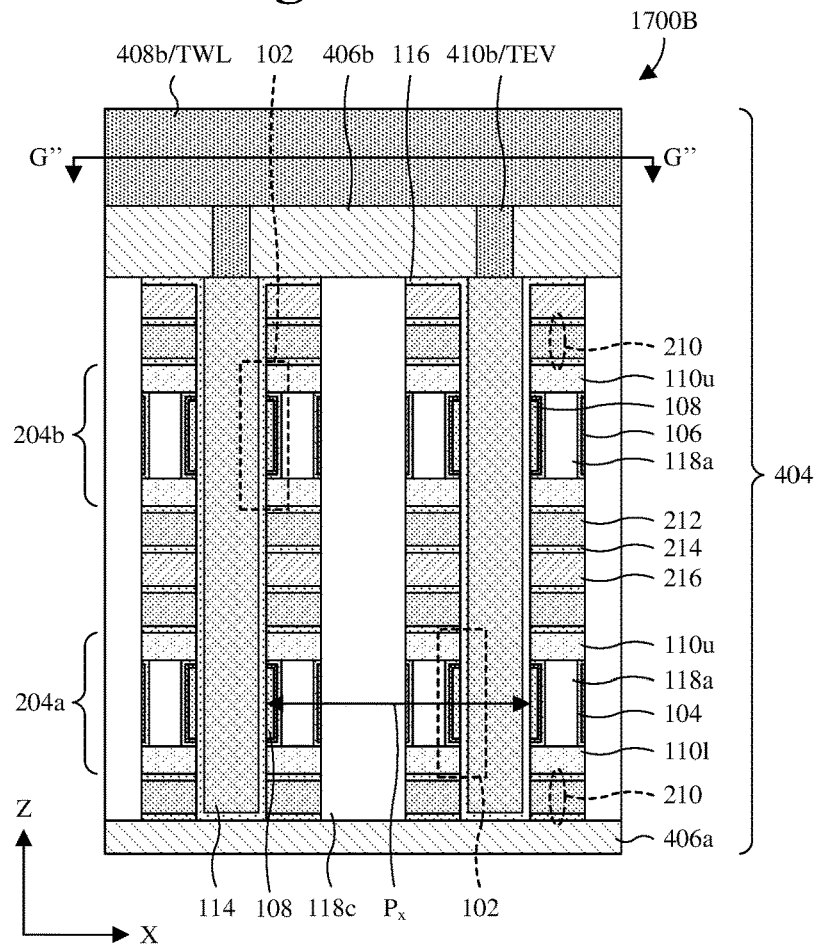

As illustrated by the top and cross-sectional views 1700A, 1700B of FIGS. 17A and 17B, the interconnect structure 404 is completed. An upper interconnect dielectric layer 406b is formed over the first and second memory arrays 204a, 204b, and a plurality of upper wires 408b and a plurality of upper vias 410b are formed stacked in the upper interconnect dielectric layer 406b. At least some of the upper wires 408b define top word lines TWL, and at least some of the upper vias 410b define top electrode vias TEV. The top word lines TWL extend correspondingly along rows of the control gate electrodes 114, and the top electrode vias TEV extend respectively from the top word lines TWL respectively to the control gate electrodes 114.

While FIGS. 8A and 8B through FIGS. 15A and 15B, FIGS. 16A-16C, and FIGS. 17A and 17B are described with reference to various embodiments of a method, it will be appreciated that the structures shown in FIGS. 8A and 8B through FIGS. 15A and 15B, FIGS. 16A-16C, and FIGS. 17A and 17B are not limited to the method but rather may stand alone separate of the method. While FIGS. 8A and 8B through FIGS. 15A and 15B, FIGS. 16A-16C, and FIGS. 17A and 17B are described as a series of acts, it will be appreciated that the order of the acts may be altered in other embodiments. While FIGS. 8A and 8B through FIGS. 15A and 15B, FIGS. 16A-16C, and FIGS. 17A and 17B illustrate and describe as a specific set of acts, some acts that are illustrated and/or described may be omitted in other embodiments. Further, acts that are not illustrated and/or described may be included in other embodiments.

Figure 18:
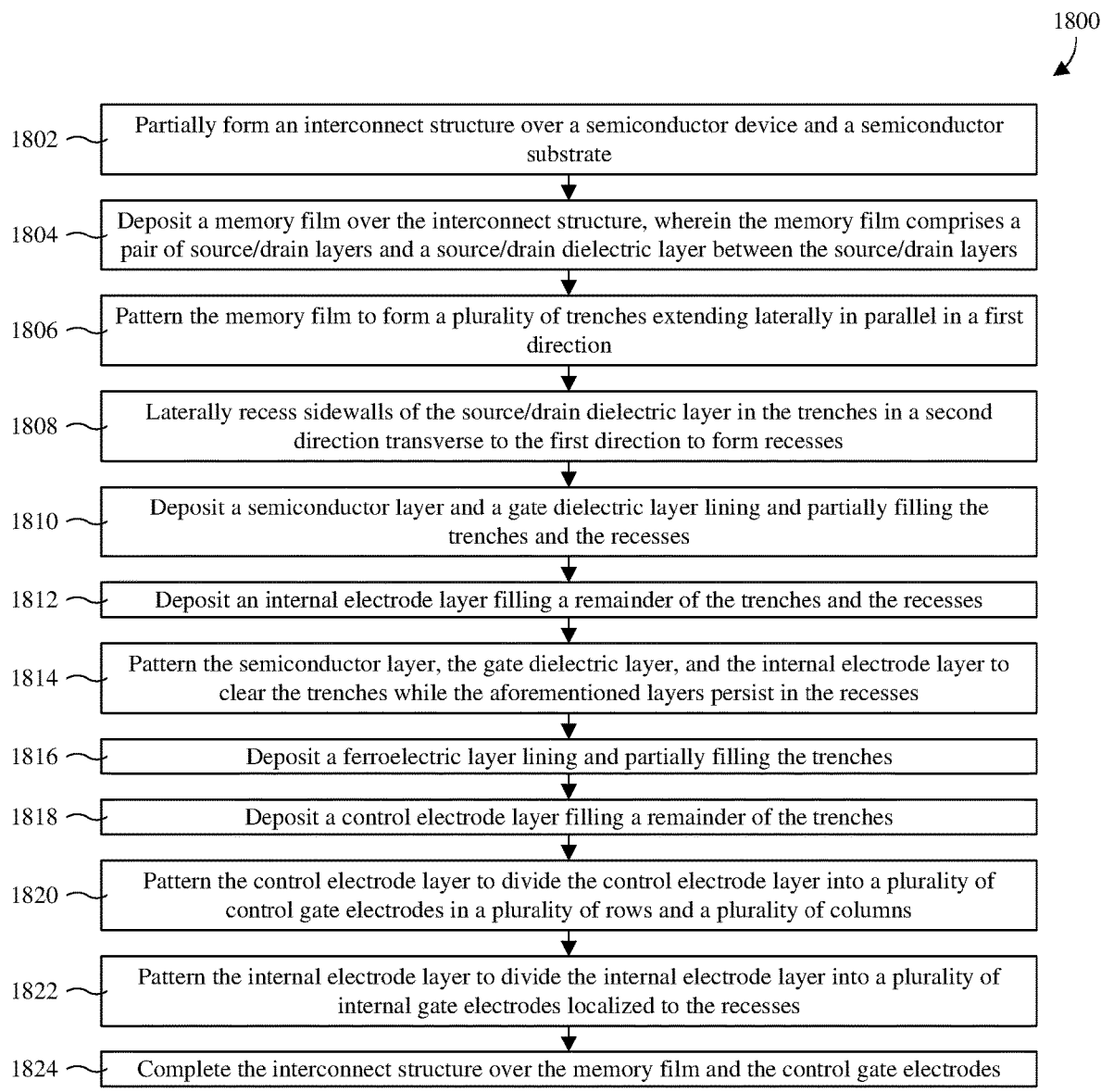
FIG. 18 illustrates a block diagram of some embodiments of the method of FIGS. 8A and 8B through FIGS. 15A and 15B, FIGS. 16A-16C, and FIGS. 17A and 17B.

With reference to FIG. 18, a block diagram 1800 of some embodiments of the method of FIGS. 8A and 8B through FIGS. 15A and 15B, FIGS. 16A-16C, and FIGS. 17A and 17B is provided.

At 1802, an interconnect structure is partially formed over a semiconductor device and a semiconductor substrate. See, for example, FIGS. 8A and 8B.

At 1804, a memory film is deposited over the interconnect structure, wherein the memory film comprises a pair of source/drain layers and a source/drain dielectric layer between the source/drain layers. See, for example, FIGS. 9A and 9B.

At 1806, the memory film is patterned to form a plurality of trenches extending laterally in parallel in a first direction. See, for example, FIGS. 10A and 10B.

At 1808, sidewalls of the source/drain dielectric layer are laterally recessed in the trenches in a second direction transverse to the first direction to form recesses. See, for example, FIGS. 11A and 11B.

At 1810, a semiconductor layer and a gate dielectric layer are deposited lining and partially filling the trenches and the recesses. See, for example, FIGS. 12A and 12B.

At 1812, an internal electrode layer is deposited filling a remainder of the trenches and the recesses. See, for example, FIGS. 12A and 12B.

At 1814, the semiconductor layer, the gate dielectric layer, and the internal electrode layer are patterned to clear the trenches while the semiconductor layer, the gate dielectric layer, and the internal electrode layer persist in the recesses. See, for example, FIGS. 13A and 13B.

At 1816, a ferroelectric layer is deposited lining and partially filling the trenches. See, for example, FIGS. 14A and 14B.

At 1818, a control electrode layer is deposited filling a remainder of the trenches. See, for example, FIGS. 14A and 14B.

At 1820, the control electrode layer is patterned to divide the control electrode layer into a plurality of control gate electrodes in a plurality of rows and a plurality of columns. See, for example, FIGS. 15A and 15B.

At 1822, the internal electrode layer is patterned to divide the internal electrode layer into a plurality of internal gate electrodes localized to the recesses. See, for example, FIGS. 16A-16C.

At 1824, the interconnect structure is completed over the memory film and the control gate electrodes. See, for example, FIGS. 17A and 17B.

While the block diagram 1800 of FIG. 18 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 19A and 19B through FIGS. 24A and 24B, FIGS. 25A-25C, and FIGS. 26A and 26B, a series of views of some embodiments of a method for forming an IC comprising a 3D memory array of MFMIS memory cells is provided in which word lines are respectively at a bottom and a top of the 3D memory array. Figures labeled with a suffix of B illustrate cross-sectional views along line A''' in like-numbered figures with a suffix of A. Where present, figures labeled with a suffix of C illustrate cross-sectional views along line B''' in like-numbered figures with a suffix of A. Figures with a suffix of A illustrate top views along line H, H', H'' (whichever is present) in like-numbered figures with a suffix of B and, where present, like-numbered figures with a suffix of C. The method is illustrated using embodiments of the IC at FIGS. 7A and 7B but may form other suitable embodiments.

Figure 19A:
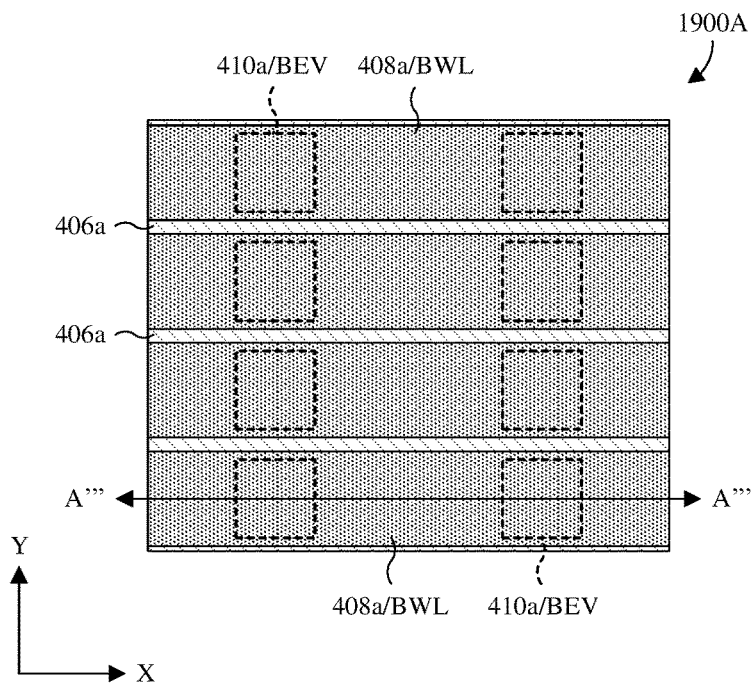
Figure 19B:
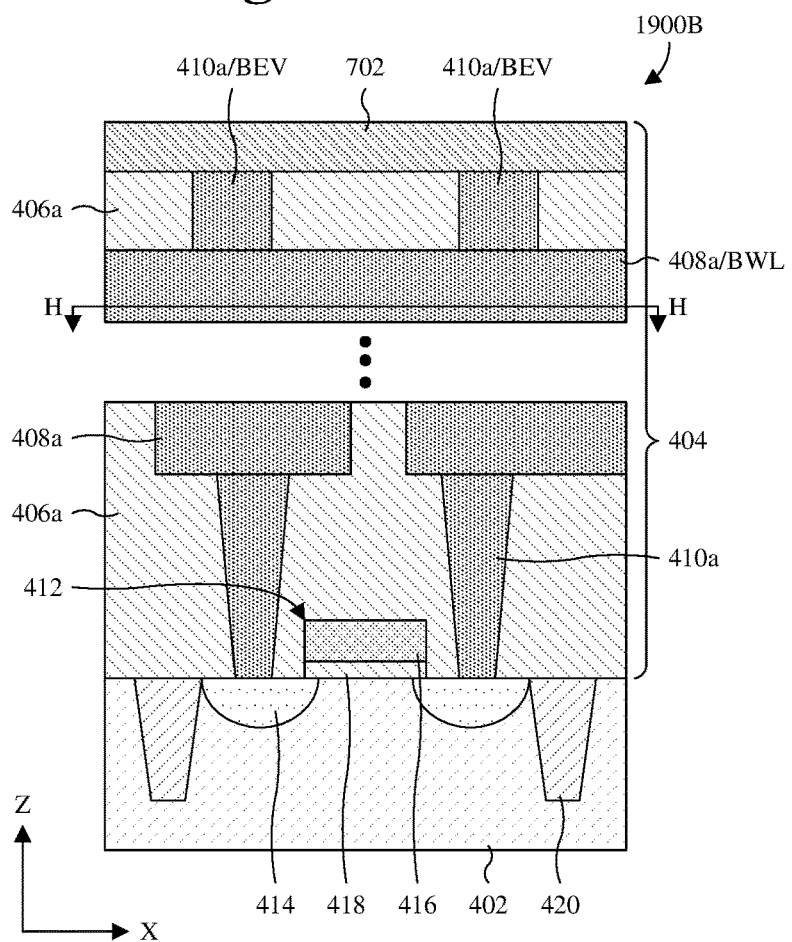

As illustrated by the top and cross-sectional views 1900A, 1900B of FIGS. 19A and 19B, a semiconductor device 412 and a trench isolation structure 420 are formed on a semiconductor substrate 402 as illustrated and described at FIGS. 8A and 8B.

Also illustrated by the top and cross-sectional views 1900A, 1900B of FIGS. 19A and 19B, an interconnect structure 404 is partially formed over the semiconductor device 412 and the semiconductor substrate 402. The interconnect structure 404 comprises a lower interconnect dielectric layer 406a, a cap dielectric layer 702, a plurality of lower wires 408a, and a plurality of lower vias 410a. The lower wires 408a and the lower vias 410a are alternatingly stacked in the lower interconnect dielectric layer 406a and define conductive paths leading from the semiconductor device 412 and other semiconductor devices (not shown) on the semiconductor substrate 402. Further, the lower wires 408a define bottom word lines BWL at a top of the interconnect structure 404, and the lower vias 410a define bottom electrode vias BEV respectively overlying the bottom word lines BWL. The cap dielectric layer 702 covers the lower interconnect dielectric layer 406a and the bottom electrode vias BEV.

Figure 20A:
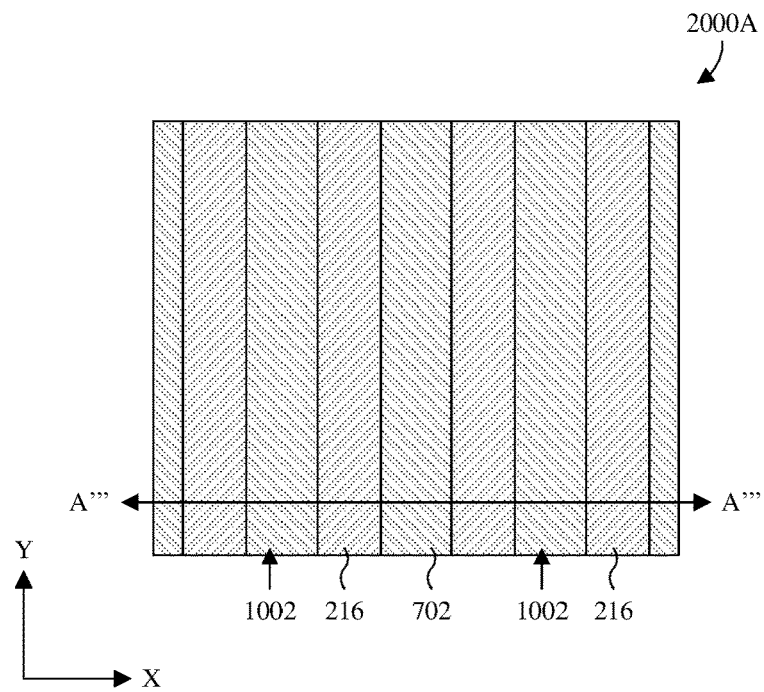
Figure 20B:
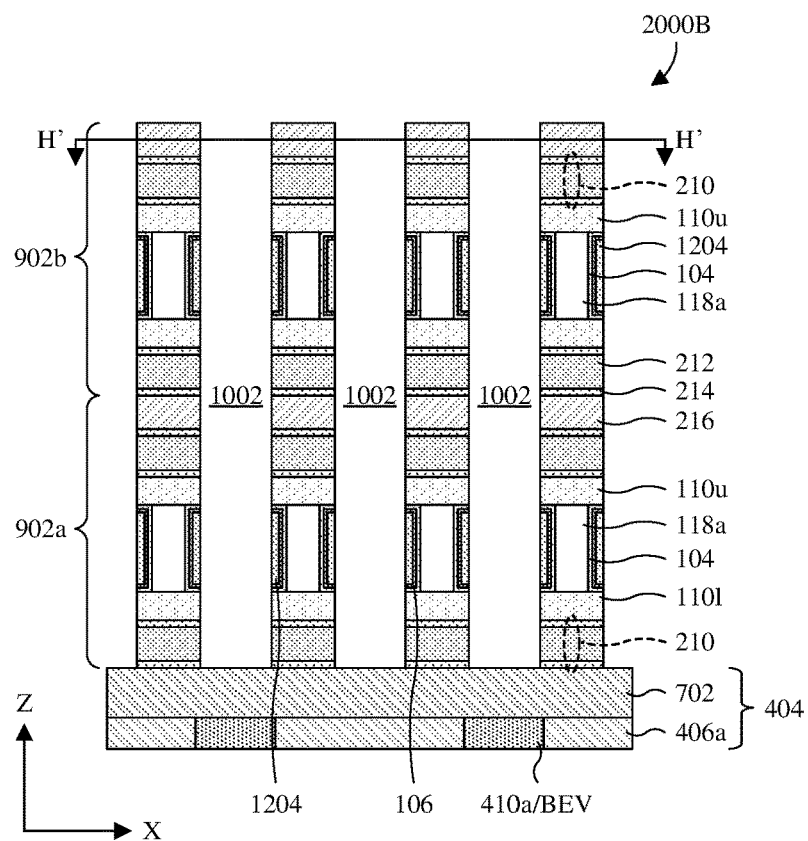

As illustrated by the top and cross-sectional views 2000A, 2000B of FIGS. 20A and 20B, the acts at FIGS. 9A and 9B through FIGS. 13A and 13B are performed. Note that for ease of illustration, only a top portion of the interconnect structure 404 is shown. A remainder of the interconnect structure 404 is as shown in FIGS. 19A and 19B.

According to the acts at FIGS. 9A and 9B through FIGS. 13A and 13B, a first memory film 902a and a second memory film 902b are deposited over the interconnect structure 404 as illustrated and described at FIGS. 9A and 9B. The first and second memory films 902a, 902b are patterned to form a plurality of trenches 1002 as illustrated and described at FIGS. 10A and 10B. The source/drain dielectric layers 118a are laterally recessed through the trenches 1002 to form recesses 1102 as illustrated and described at FIGS. 11A and 11B. A semiconductor layer 1202, a gate dielectric layer 106, and an internal electrode layer 1204 are formed filling the trenches 1002 (see, e.g., FIGS. 11A and 11B) and the recesses 1102 (see, e.g., FIGS. 11A and 11B) as illustrated and described at FIGS. 12A and 12B. The trenches 1002 are cleared as described at FIGS. 13A and 13B.

Figure 21A:
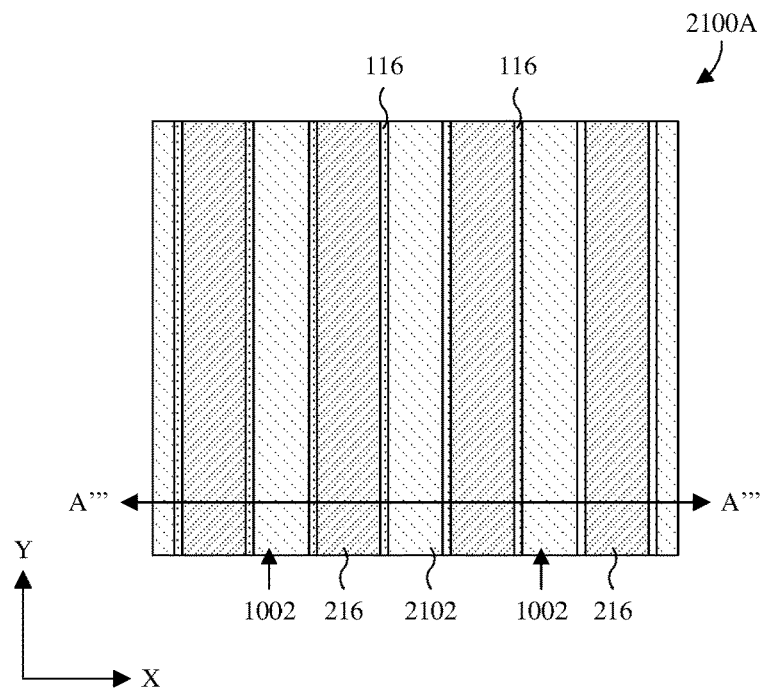
Figure 21B:
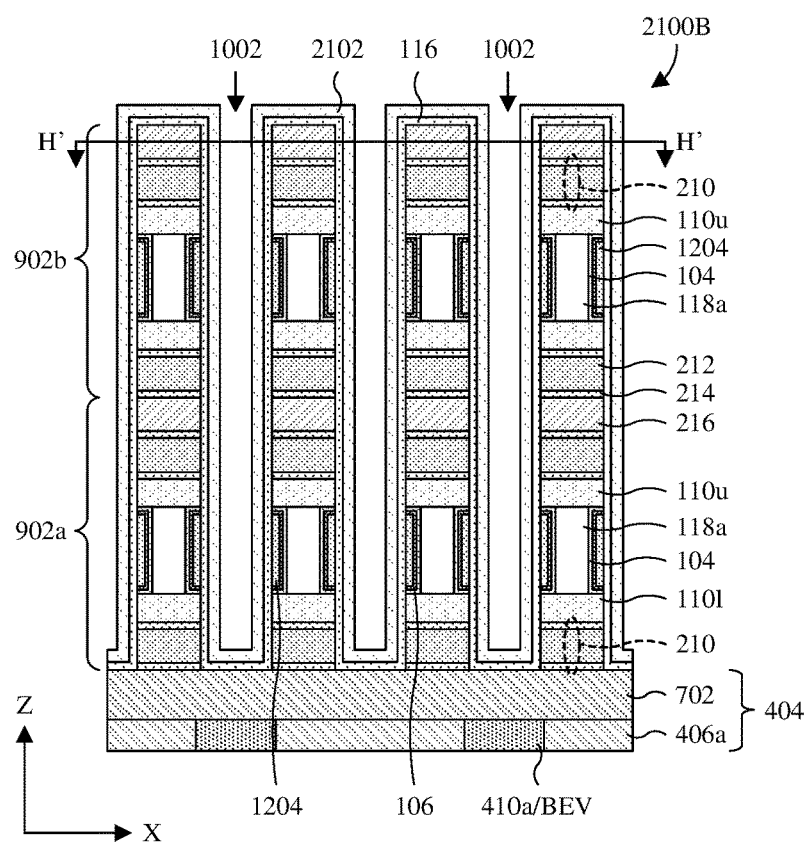

As illustrated by the top and cross-sectional views 2100A, 2100B of FIGS. 21A and 21B, a ferroelectric layer 116 is deposited lining and partially filling the trenches 1002. Further, a spacer layer 2102 is deposited lining and partially filling the trenches 1002 over the ferroelectric layer 116. The spacer layer 2102 may, for example, be or comprise silicon nitride and/or some other suitable dielectric(s).

Figure 22A:
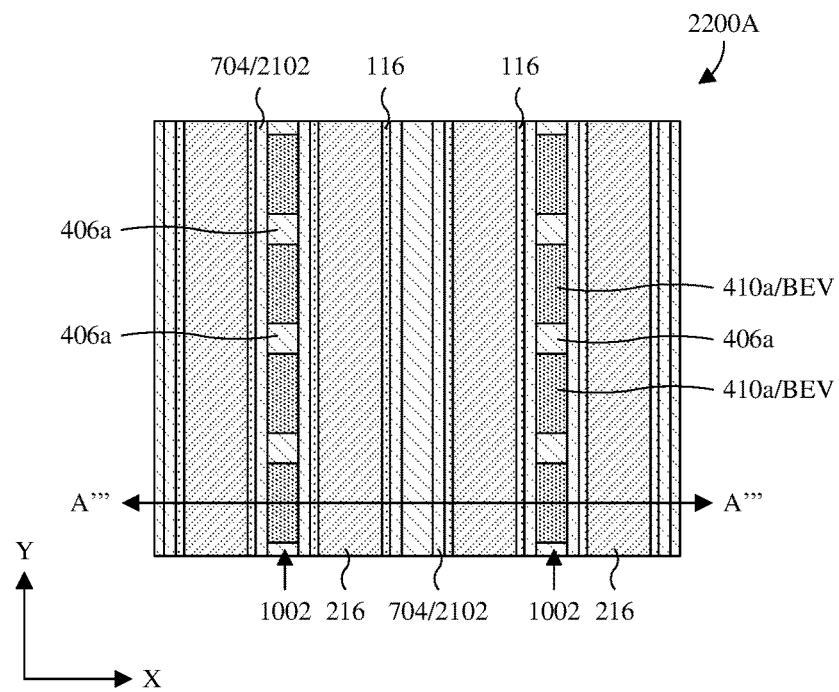
Figure 22B:
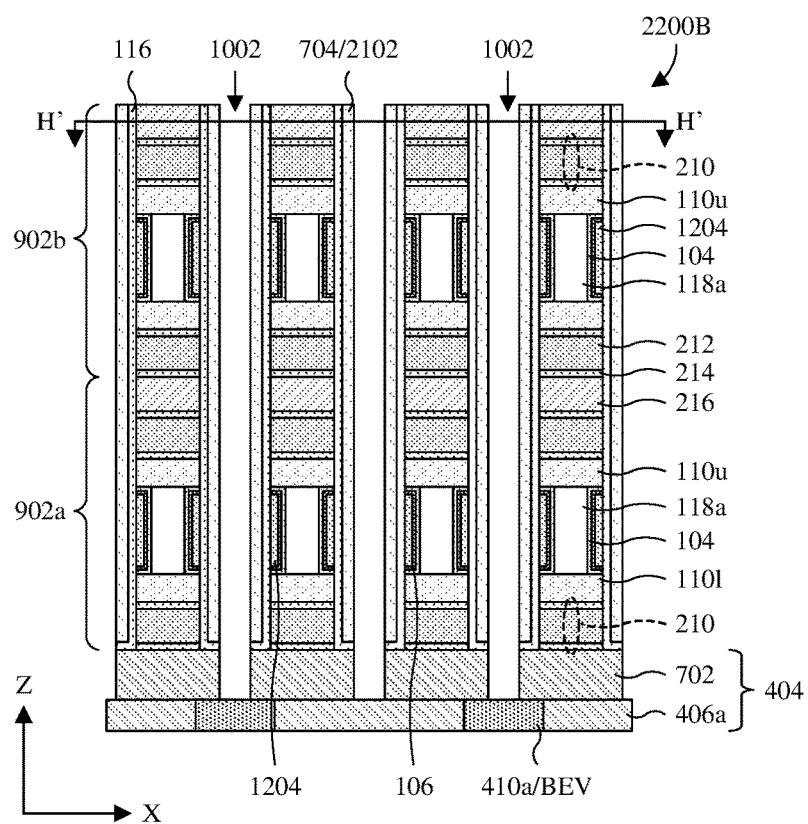

As illustrated by the top and cross-sectional views 2200A, 2200B of FIGS. 22A and 22B, an etching process is performed into the spacer layer 2102, the ferroelectric layer 116, and the cap dielectric layer 702 to extend the trenches 1002 to the bottom electrode vias BEV. Initially, the spacer layer 2102 is etched back and spacers 704 are formed from the spacer layer 2102 on sidewalls of the trenches 1002. Thereafter, the spacers 704 and the array dielectric layer 216 of the second memory film 902b serve as a mask while etching through the cap dielectric layer 702 and the ferroelectric layer 116. These two steps of the etching process may, for example, be performed by the same etch or by different etches.

In alternative embodiments, instead of forming the spacer layer 2102 at FIGS. 21A and 21B and subsequently performing the etching process at FIGS. 22A and 22B, a photolithography/etching process may be performed to form openings at bottoms of the trenches 1002 that extend respectively to the bottom electrode vias BEV. The method may then proceed as described hereafter. These alternative embodiments may, for example, be employed to form the IC according to the embodiments of FIGS. 6A and 6B.

Figure 23A:
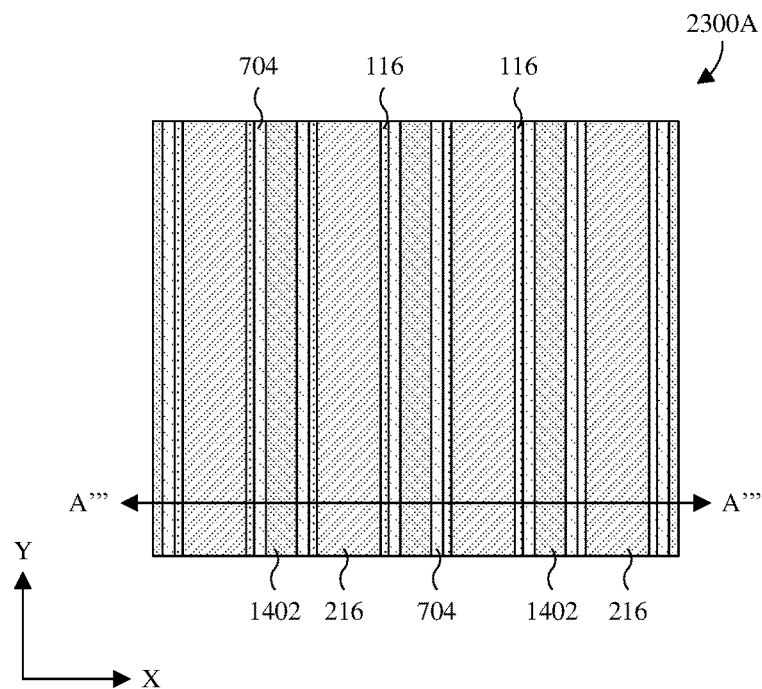
Figure 23B:
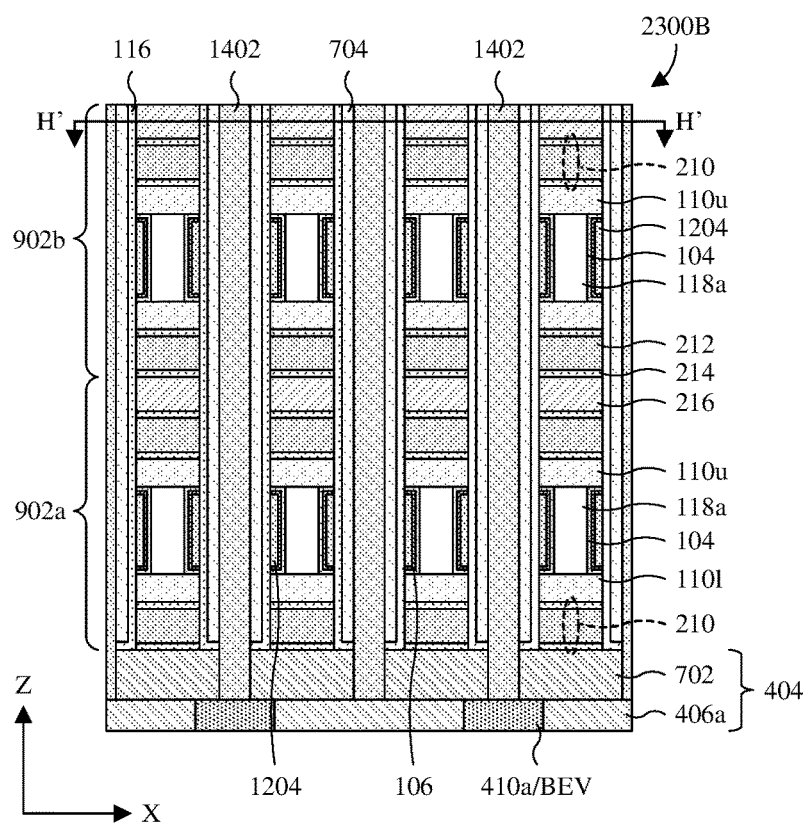

As illustrated by the top and cross-sectional views 2300A, 2300B of FIGS. 23A and 23B, a control electrode layer 1402 is formed filling the trenches 1102 as illustrated and described at FIGS. 14A and 14B.

Figure 24A:
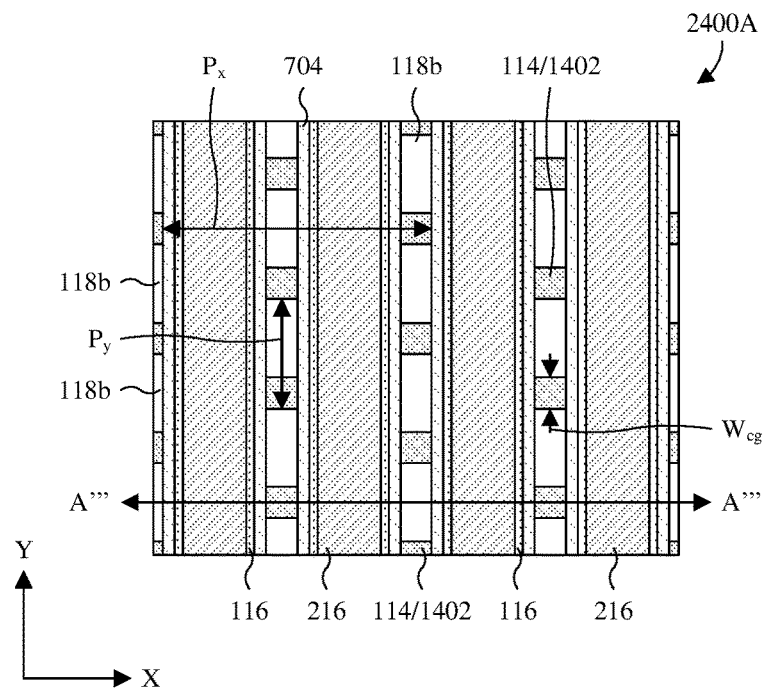
Figure 24B:
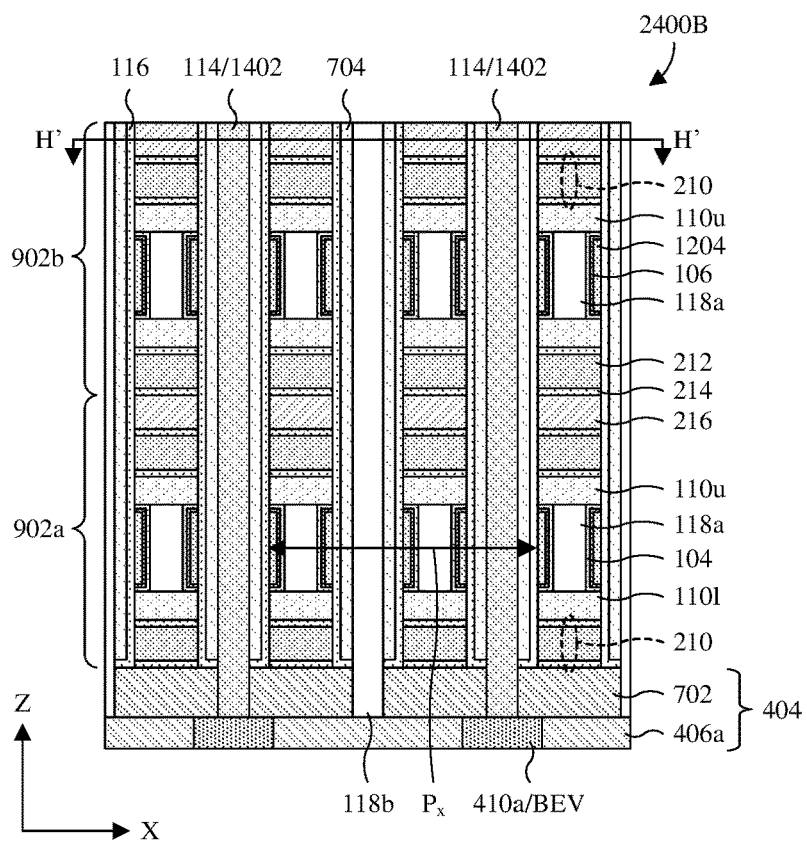

As illustrated by the top and cross-sectional views 2400A, 2400B of FIGS. 24A and 24B, a first inter-gate dielectric layer 118b is formed extending through the control electrode layer 1402 and dividing the control electrode layer 1402 into a plurality of control gate electrodes 114 as illustrated and described at FIGS. 15A and 15B.

Figure 25A:
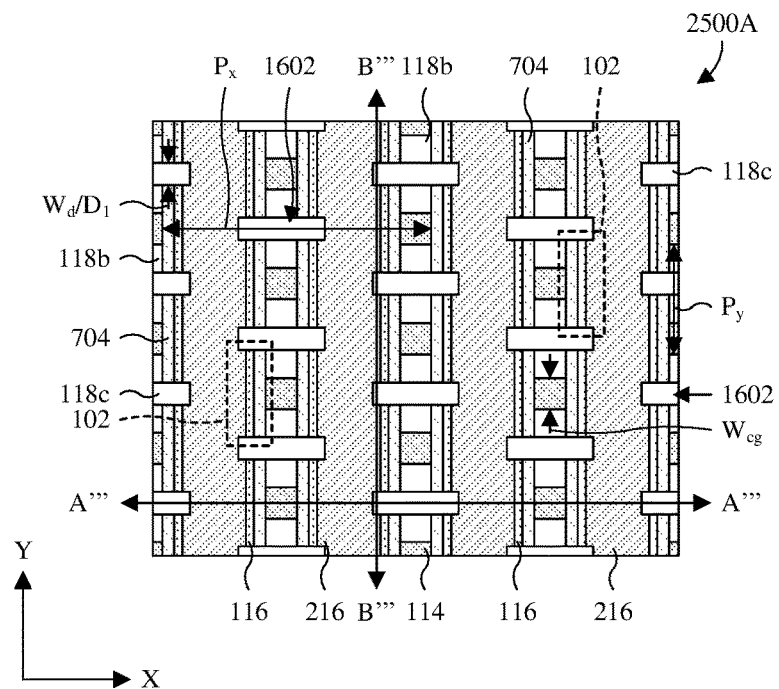
Figure 25B:
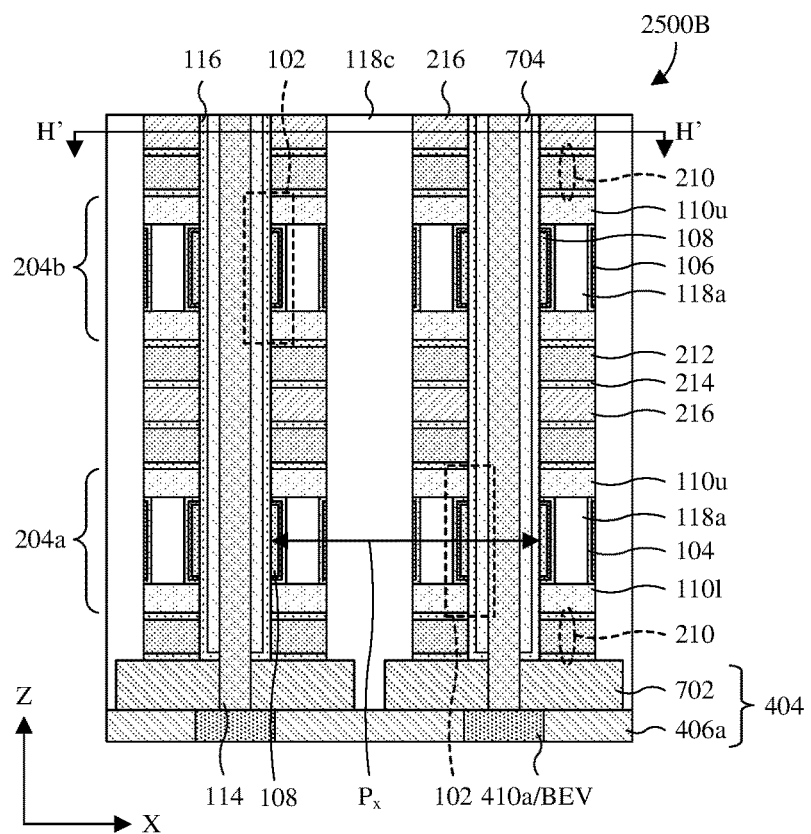
Figure 25C:
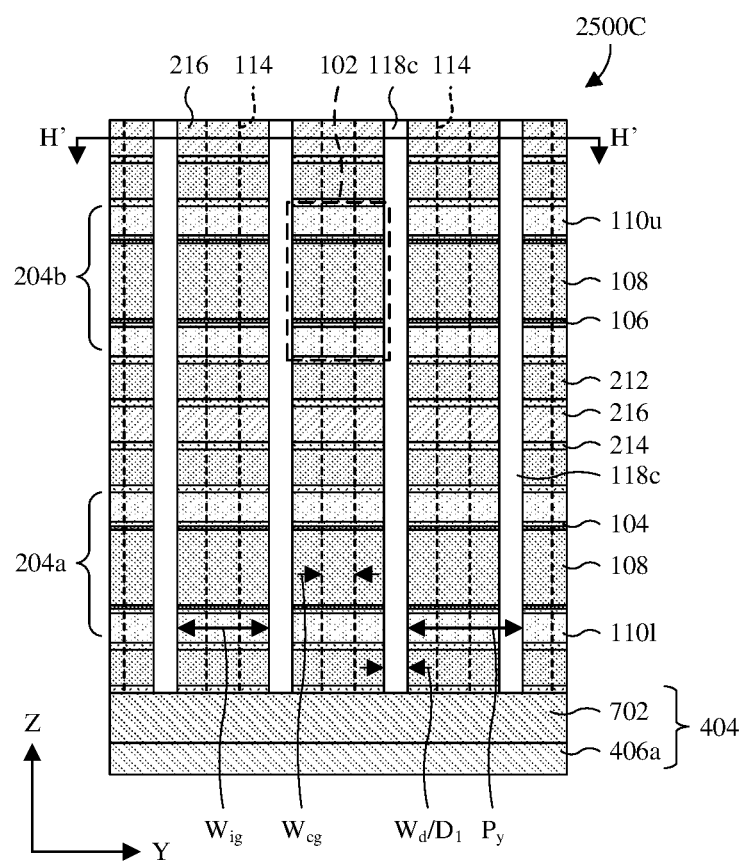

As illustrated by the top and cross-sectional views 2500A-2500C of FIGS. 25A-25C, a second inter-gate dielectric layer 118c is formed extending through the internal electrode layer 1204, the ferroelectric layer 116, the spacers 704, and the first inter-gate dielectric layer 118b as illustrated and described at FIGS. 16A and 16B. The second inter-gate dielectric layer 118c divides the internal electrode layer 1204 into a plurality of internal gate electrodes 108.

Forming the second inter-gate dielectric layer 118c and dividing the internal electrode layer 1204 into the plurality of internal gate electrodes 108 completes a first memory array 204a and a second memory array 204b. The first and second memory arrays 204a, 204b are vertically stacked over the lower interconnect dielectric layer 406a and are made up of plurality of MFMIS memory cells 102. Each of the MFMIS memory cells 102 has an individual one of the internal gate electrodes 108 and further has a localized portion of the ferroelectric layer 116. The localized portion of the ferroelectric layer 116 has a polarity representing a bit of data.

Figure 26A:
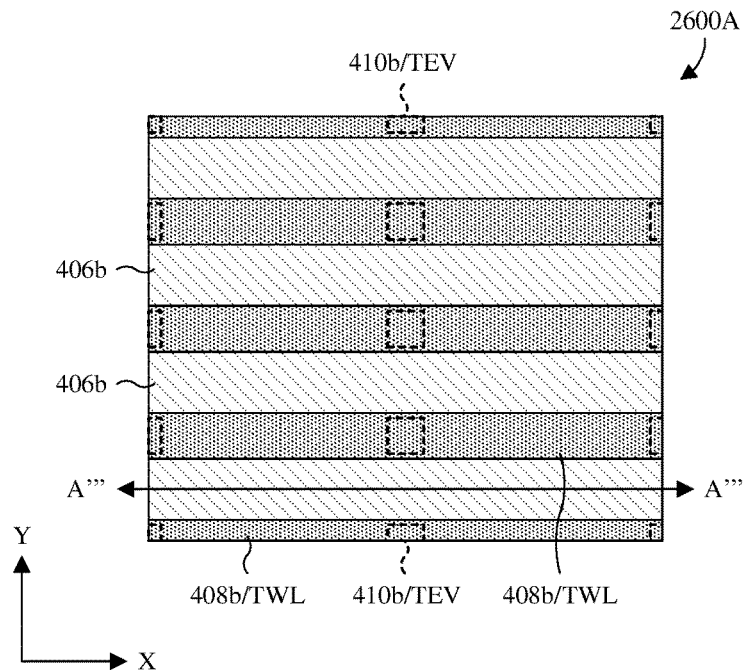
Figure 26B:
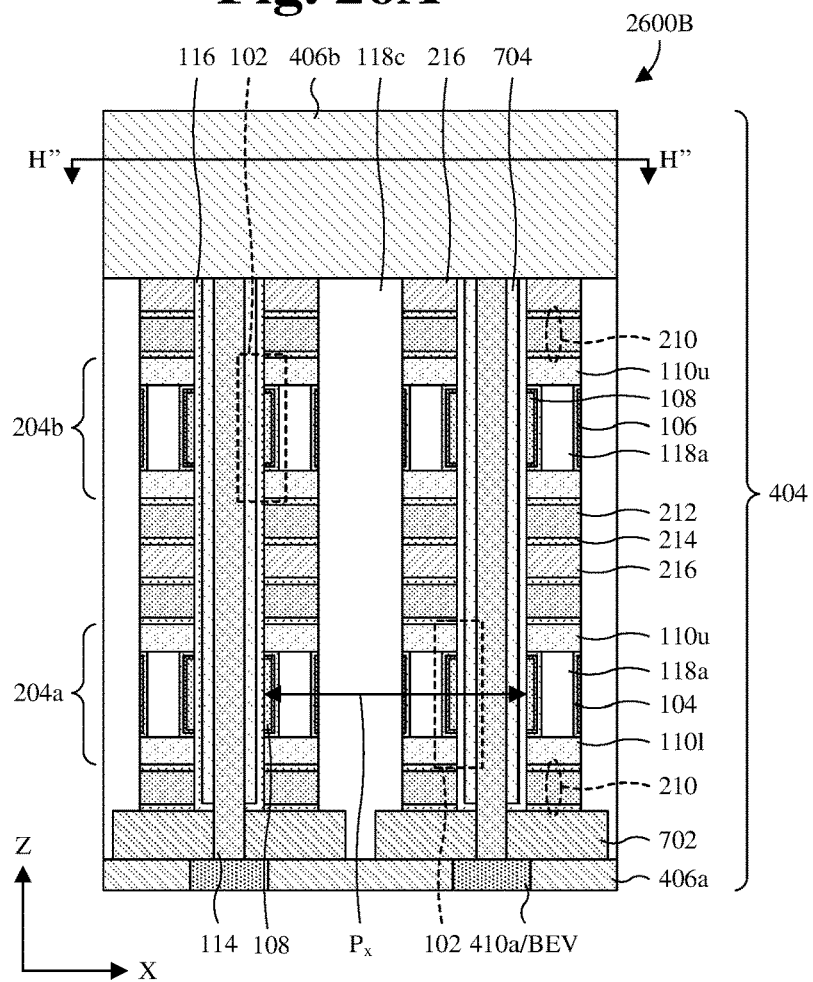

As illustrated by the top and cross-sectional views 2600A, 2600B of FIGS. 26A and 26B, the interconnect structure 404 is completed as illustrated and described at FIGS. 17A and 17B. In contrast with FIGS. 17A and 17B, top word lines TWL and top electrode vias TEV are formed at even numbered rows or odd numbered rows, but not both.

While FIGS. 19A and 19B through FIGS. 24A and 24B, FIGS. 25A-25C, and FIGS. 26A and 26B are described with reference to various embodiments of a method, it will be appreciated that the structures shown in FIGS. 19A and 19B through FIGS. 24A and 24B, FIGS. 25A-25C, and FIGS. 26A and 26B are not limited to the method but rather may stand alone separate of the method. While FIGS. 19A and 19B through FIGS. 24A and 24B, FIGS. 25A-25C, and FIGS. 26A and 26B are described as a series of acts, it will be appreciated that the order of the acts may be altered in other embodiments. While FIGS. 19A and 19B through FIGS. 24A and 24B, FIGS. 25A-25C, and FIGS. 26A and 26B illustrate and describe as a specific set of acts, some acts that are illustrated and/or described may be omitted in other embodiments. Further, acts that are not illustrated and/or described may be included in other embodiments.

Figure 27:
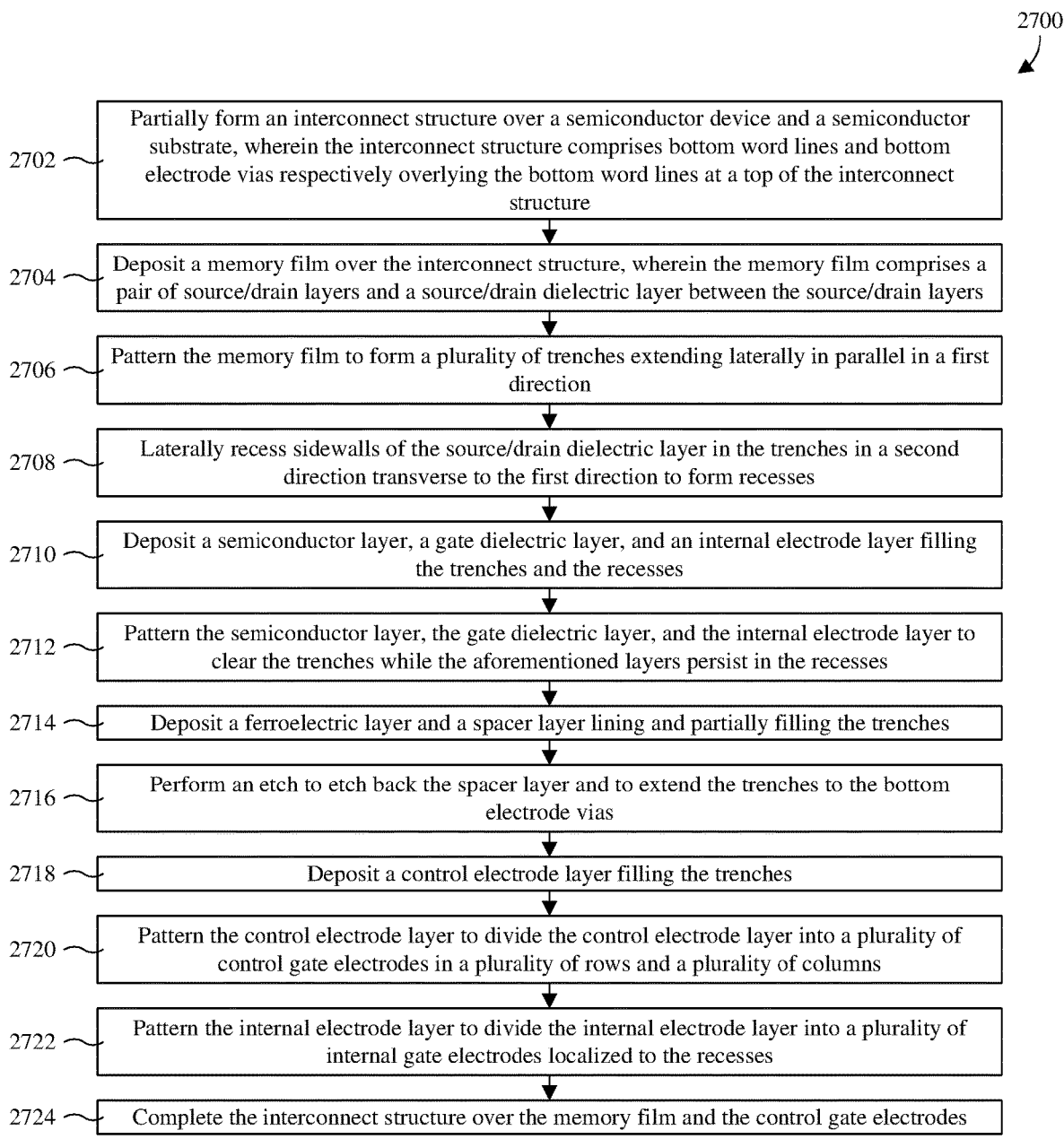
FIG. 27 illustrates a block diagram of some embodiments of the method of FIGS. 19A and 19B through FIGS. 24A and 24B, FIGS. 25A-25C, and FIGS. 26A and 26B.

With reference to FIG. 27, a block diagram 2700 of some embodiments of the method of FIGS. 19A and 19B through FIGS. 24A and 24B, FIGS. 25A-25C, and FIGS. 26A and 26B is provided.

At 2702, an interconnect structure is partially formed over a semiconductor device and a semiconductor substrate, wherein the interconnect structure comprises bottom electrode wires and bottom electrode vias respectively overlying the bottom electrode wires at a top of the interconnect structure. See, for example, FIGS. 19A and 19B.

At 2704, a memory film is deposited over the interconnect structure, wherein the memory film comprises a pair of source/drain layers and a source/drain dielectric layer between the source/drain layers. See, for example, FIGS. 20A and 20B.

At 2706, the memory film is patterned to form a plurality of trenches extending laterally in parallel in a first direction. See, for example, FIGS. 20A and 20B.

At 2708, sidewalls of the source/drain dielectric layer are laterally recessed in the trenches in a second direction transverse to the first direction to form recesses. See, for example, FIGS. 20A and 20B.

At 2710, a semiconductor layer, a gate dielectric layer, and an internal electrode layer are deposited filling the trenches and the recesses. See, for example, FIGS. 20A and 20B.

At 2712, the semiconductor layer, the gate dielectric layer, and the internal electrode layer are patterned to clear the trenches while the semiconductor layer, the gate dielectric layer, and the internal electrode persist in the recesses. See, for example, FIGS. 20A and 20B.

At 2714, a ferroelectric layer and a spacer layer are deposited lining and partially filling the trenches. See, for example, FIGS. 21A and 21B.

At 2716, an etch is performed to etch back the spacer layer and to extend the trenches to the bottom electrode vias. See, for example, FIGS. 22A and 22B.

At 2718, a control electrode layer is deposited filling the trenches. See, for example, FIGS. 23A and 23B.

At 2720, the control electrode layer is patterned to divide the control electrode layer into a plurality of control gate electrodes in a plurality of rows and a plurality of columns. See, for example, FIGS. 24A and 24B.

At 2722, the internal electrode layer is patterned to divide the internal electrode layer into a plurality of internal gate electrodes localized to the recesses. See, for example, FIGS. 25A-25C.

At 2724, the interconnect structure is completed over the memory film and the control gate electrodes. See, for example, FIGS. 26A and 26B.

While the block diagram 2700 of FIG. 27 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides a memory device including: a first source/drain region and a second source/drain region overlying the first source/drain region; an internal gate electrode and a semiconductor channel that overlie the first source/drain region and that underlie the second source/drain region, wherein the semiconductor channel extends from the first source/drain region to the second source/drain region; a gate dielectric layer between and bordering the internal gate electrode and the semiconductor channel; a control gate electrode on an opposite side of the internal gate electrode as the semiconductor channel and uncovered by the second source/drain region; and a ferroelectric layer between and bordering the control and internal gate electrodes. In some embodiments, the control gate electrode has a first sidewall facing the internal gate electrode, wherein internal gate electrode has a second sidewall facing the control gate electrode, and wherein the first and second sidewalls have different widths. In some embodiments, the first sidewall has a width less than that of the second sidewall. In some embodiments, a height of the control gate electrode is greater than a vertical separation between a top surface of the second source/drain region and a bottom surface of the first source/drain region. In some embodiments, the gate dielectric layer wraps around a corner of the internal gate electrode from a sidewall of the internal gate electrode to a top surface of the internal gate electrode. In some embodiments, the semiconductor channel has a C-shaped profile wrapping around a side of the internal gate electrode. In some embodiments, the memory device further includes: a second internal gate electrode on an opposite side of the control gate electrode as the ferroelectric layer; and a second ferroelectric layer between and bordering the second internal gate electrode and the control gate electrode.

In some embodiments, the present disclosure provides another memory device including: a first source/drain region and a second source/drain region overlying the first source/drain region; a first gate electrode and a semiconductor layer vertically between the first and second source/drain regions, wherein the first gate electrode is electrically floating; a gate dielectric layer laterally between and bordering the first gate electrode and the semiconductor layer, wherein the first gate electrode, the semiconductor and gate dielectric layers, and the first and second source/drain regions define a common sidewall; a ferroelectric layer lining the common sidewall; and a second gate electrode bordering the ferroelectric layer on an opposite side of the ferroelectric layer as the common sidewall. In some embodiments, the first and second gate electrodes and the semiconductor layer are laterally spaced in a first direction, wherein the first and second gate electrodes have different widths in a second direction orthogonal to the first direction. In some embodiments, the first and second gate electrodes respectively have a first sidewall and a second sidewall that are facing, wherein the second sidewall has a surface area from the first source/drain region to the second source/drain region that is less than a surface area of the first sidewall. In some embodiments, the common sidewall is defined in part by individual sidewalls of the first and second source/drain regions and an individual sidewall of the first gate electrode, wherein the ferroelectric layer is on the individual sidewalls of the first and second source/drain regions and the individual sidewall of the first gate electrode. In some embodiments, the second source/drain region completely covers the first gate electrode and the semiconductor layer. In some embodiments, the memory device further includes: a first memory cell defined by the first and second source/drain regions, the first and second gate electrodes, and the semiconductor layer; and a second memory cell overlying the first memory cell and sharing the second gate electrode with the first memory cell.

In some embodiments, the present disclosure provides a method for forming a memory device including: depositing a memory film over a substrate, wherein the memory film includes a pair of source/drain layers and a source/drain dielectric layer between the source/drain layers; performing a first etch into the memory film to form a trench through the memory film; recessing a sidewall of the source/drain dielectric layer relative to sidewalls of the source/drain layers through the trench to form a recess; depositing a semiconductor layer lining the recess and the trench; depositing a first electrode layer filling the recess and the trench over the semiconductor layer; performing a second etch into the semiconductor layer and the first electrode layer to clear the semiconductor layer and the first electrode layer from the trench; depositing a ferroelectric layer lining the trench and further lining the first electrode layer and the semiconductor layer at the recess; and depositing a second electrode layer filling the trench over the ferroelectric layer. In some embodiments, the method further includes: performing a third etch into the second electrode layer to form a control gate electrode bordering the first electrode layer; and performing a fourth etch into the first electrode layer to form a floating gate electrode localized to the recess. In some embodiments, the third etch forms the control gate electrode having a sidewall facing the recess with a first width, wherein the fourth etch forms the floating gate electrode having a sidewall facing the control gate electrode with a second width greater than the first width. In some embodiments, the method further includes depositing a high k gate dielectric layer lining the recess and the trench between the depositing of the semiconductor layer and the depositing of the first electrode layer. In some embodiments, the semiconductor layer is deposited on the sidewall of the source/drain dielectric layer and the sidewalls of the source/drain layers and is subsequently cleared from the sidewalls of the source/drain layers by the second etch, wherein the ferroelectric layer is deposited on the sidewall of the source/drain dielectric layer and the sidewalls of the source/drain layers. In some embodiments, the memory film includes a pair of second source/drain layers overlying the pair of source/drain layers and further includes a second source/drain dielectric layer between the second source/drain layers, wherein the recessing recesses a sidewall of the second source/drain dielectric layer relative to sidewalls of the second source/drain layers through the trench to form a second recess. In some embodiments, the recessing recesses a second sidewall of the source/drain dielectric layer relative to second sidewalls of the source/drain layers through the trench to form a second recess, wherein the second recess is on an opposite side of the trench as the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a memory device, the method comprising:
depositing a memory film over a substrate, wherein the memory film comprises a pair of source/drain layers and a source/drain dielectric layer between the source/drain layers;

performing a first etch into the memory film to form a trench through the memory film;

recessing a sidewall of the source/drain dielectric layer relative to sidewalls of the source/drain layers through the trench to form a recess;

depositing a semiconductor layer lining the recess and the trench;

depositing a first electrode layer filling the recess and the trench over the semiconductor layer;

performing a second etch into the semiconductor layer and the first electrode layer to clear the semiconductor layer and the first electrode layer from the trench;

depositing a ferroelectric layer lining the trench and further lining the first electrode layer and the semiconductor layer at the recess; and depositing a second electrode layer filling the trench over the ferroelectric layer.

2. The method according to claim 1, further comprising:

performing a third etch into the second electrode layer to form a control gate electrode bordering the first electrode layer; and performing a fourth etch into the first electrode layer to form a floating gate electrode localized to the recess.

3. The method according to claim 2, wherein the third etch forms the control gate electrode having a sidewall facing the recess with a first width, and wherein the fourth etch forms the floating gate electrode having a sidewall facing the control gate electrode with a second width greater than the first width.

4. The method according to claim 1, further comprising:

depositing a high k gate dielectric layer lining the recess and the trench between the depositing of the semiconductor layer and the depositing of the first electrode layer.

5. The method according to claim 1, wherein the semiconductor layer is deposited on the sidewall of the source/drain dielectric layer and the sidewalls of the source/drain layers and is subsequently cleared from the sidewalls of the source/drain layers by the second etch, and wherein the ferroelectric layer is deposited on the sidewalls of the source/drain layers.

6. The method according to claim 1, wherein the memory film comprises a pair of second source/drain layers overlying the pair of source/drain layers and further comprises a second source/drain dielectric layer between the second source/drain layers, and wherein the recessing recesses a sidewall of the second source/drain dielectric layer relative to sidewalls of the second source/drain layers through the trench to form a second recess.

7. The method according to claim 1, wherein the recessing recesses a second sidewall of the source/drain dielectric layer relative to second sidewalls of the source/drain layers through the trench to form a second recess, and wherein the second recess is on an opposite side of the trench as the recess.

8. A method for forming a memory device, the method comprising:

forming a pair of source/drain layers and a dielectric layer vertically stacked with the dielectric layer between the source/drain layers, wherein the source/drain layers and the dielectric layer have individual sidewalls forming a common sidewall;

performing an etch into the individual sidewall of the dielectric layer to laterally offset the individual sidewall relative to the individual sidewalls of the source/drain layers, wherein the etch forms a recess at the individual sidewall of the dielectric layer;

forming a conductor-insulator-semiconductor (CIS) structure on the individual sidewall of the dielectric layer, wherein the CIS structure comprises an internal gate electrode that is continuous and in the recess;

depositing a ferroelectric layer and a conductive layer lining the individual sidewalls of the source/drain layers and an individual sidewall of the CIS structure; and after the depositing of the ferroelectric layer and the conductive layer, forming a dielectric wall dividing the internal gate electrode into discrete segments spaced from each other in the recess, wherein the dielectric wall is spaced from the conductive layer.

9. The method according to claim 8, wherein the individual sidewalls of the source/drain layers are laterally elongated in a direction, and wherein the method comprises:

performing a second etch into the conductive layer to segment the conductive layer into a plurality of control gate electrodes laterally spaced in the direction; and performing a third etch into the ferroelectric layer to segment the ferroelectric layer into a plurality of ferroelectric segments laterally spaced in the direction.

10. The method according to claim 8, wherein the source/drain layers and the dielectric layer have individual seconds sidewalls that form a second common sidewall on an opposite side of the dielectric layer as the common sidewall, and wherein the etch further laterally offsets the individual second sidewall of the dielectric layer relative to the individual second sidewalls of the source/drain layers.

11. The method according to claim 8, further comprising:

forming a pair of second source/drain layers and a second dielectric layer vertically stacked over the source/drain layers and with the second dielectric layer between the second source/drain layers, wherein the second source/drain layers and the second dielectric layer have individual sidewalls further forming the common sidewall, and wherein the etch further laterally offsets the individual sidewall of the second dielectric layer relative to the individual sidewalls of the second source/drain layers.

12. A method for forming a memory device, the method comprising:

depositing a memory film over a substrate;

patterning the memory film to form a plurality of trenches elongated in parallel;

performing an etch into individual sidewalls of the memory film through the trenches to form a plurality of recesses in the individual sidewalls;

depositing a metal-insulator-semiconductor (MIS) film filling the trenches and the recesses;

patterning the MIS film to form a plurality of MIS structures individual to and respectively in the recesses; and forming a plurality of ferroelectric layers and a plurality of control gates in the trenches, wherein the ferroelectric layers, the control gates, and metal of the MIS structures form a plurality of metal-ferroelectric-metal (MFM) structures in the trenches, and wherein the plurality of control gates comprise a first control gate and a second control gate that are spaced from each other in a common trench of the plurality of trenches and that have individual sidewalls facing a continuous semiconductor segment of the MIS film on a common side of the common trench.

13. The method according to claim 12, wherein the memory film comprises a first source/drain layer, a first dielectric layer overlying the first source/drain layer, a second source/drain layer overlying the first dielectric layer, a second dielectric layer overlying the second source/drain layer, a third source/drain layer overlying the second dielectric layer, a third dielectric layer overlying the third source/drain layer, and a fourth source/drain layer overlying the third dielectric layer, and wherein the recesses form at the first and third dielectric layers.

14. The method according to claim 12, wherein the MIS structures form first capacitors having a first capacitor area, and wherein the MFM structures form second capacitors having a second capacitor area different than the first capacitor area.

15. The method according to claim 12, wherein the forming of the plurality of ferroelectric layers and the plurality of control gates comprises:
depositing a bulk ferroelectric layer and a spacer layer lining the trenches;
performing a second etch to etch back the bulk ferroelectric layer and the spacer layer and to extend the trenches to wires respectively underlying the trenches;
depositing a conductive layer filling a remainder of the trenches; and
patterning the conductive layer and the bulk ferroelectric layer respectively into the control gates and the ferroelectric layers.

16. The method according to claim 8, wherein the CIS structure comprises a semiconductor layer and an insulator layer, wherein the semiconductor layer, the internal gate electrode, and the insulator layer form another common sidewall, and wherein the ferroelectric layer is deposited lining the other common sidewall.

17. The method according to claim 8, wherein the CIS structure comprises a semiconductor layer and an insulator layer, and wherein the insulator layer is deposited underlying an upper portion of the semiconductor layer, and overlying a lower portion of the semiconductor layer, in the recess.

18. The method according to claim 8, wherein a plurality of dielectric walls, including the dielectric wall, are formed in a row after the depositing of the ferroelectric layer and the conductive layer, wherein the plurality of dielectric walls divide the internal gate electrode in the recess and further divide the ferroelectric layer into a plurality of discrete segments spaced from each other.

19. The method according to claim 12, wherein the plurality of MIS structures comprise a first MIS structure and a second MIS structure sharing the continuous semiconductor segment in a common recess of the plurality of recesses.

20. The method according to claim 12, wherein the plurality of MIS structures comprise a first MIS structure, which comprises an electrode layer and the continuous semiconductor segment, and wherein the plurality of ferroelectric layers comprises a first ferroelectric layer that is deposited lining individual sidewalls of the electrode layer and the continuous semiconductor segment.

* * * * *